(12) United States Patent
Park et al.

(10) Patent No.: US 9,887,330 B2
(45) Date of Patent: Feb. 6, 2018

(54) LIGHT-EMITTING APPARATUS AND LIGHT-EMITTING MODULE INCLUDING THE SAME

(71) Applicant: SAMSUNG ELECTRONICS CO., LTD., Suwon-si (KR)

(72) Inventors: Hun-yong Park, Seoul (KR); Sang-hyun Lee, Suwon-si (KR); Gam-han Yong, Suwon-si (KR); Eui-seok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/195,329

(22) Filed: Jun. 28, 2016

(65) Prior Publication Data

US 2017/0012188 A1 Jan. 12, 2017

(30) Foreign Application Priority Data

Jul. 10, 2015 (KR) .................. 10-2015-0098410

(51) Int. Cl.
| | |
|---|---|
| *H01L 33/00* | (2010.01) |
| *H01L 21/00* | (2006.01) |
| *H01L 33/60* | (2010.01) |
| *H01L 33/50* | (2010.01) |
| *H01L 33/58* | (2010.01) |

(52) U.S. Cl.
CPC ............. *H01L 33/60* (2013.01); *H01L 33/50* (2013.01); *H01L 33/58* (2013.01); *H01L 2224/16* (2013.01); *H01L 2924/181* (2013.01)

(58) Field of Classification Search
CPC ........................................................ H01L 27/30
USPC ...... 257/13, 79–103, 918, 40, 642–643, 759; 438/22–47, 69, 493, 503, 507, 956
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| JP | 2013-38190 A | 2/2013 |
| JP | 5571313 B2 | 8/2014 |

(Continued)

*Primary Examiner* — Moin Rahman
(74) *Attorney, Agent, or Firm* — Sughrue Mion, PLLC

(57) ABSTRACT

A light-emitting apparatus includes a reflective layer including a cavity that penetrates the reflective layer from a top surface to a bottom surface of the reflective layer; a light-emitting device disposed in the cavity, the light-emitting device including a light-emitting stack and an electrode connected to the light-emitting stack at a bottom surface of the light-emitting stack; and a wavelength conversion layer that fills the cavity and covers a top surface and a side surface of the light-emitting device, wherein the wavelength conversion layer exposes at least a portion of the electrode to an outside.

16 Claims, 23 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,633,503 B2 | 1/2014 | Seo |
| 8,735,931 B2 | 5/2014 | Han et al. |
| 8,766,295 B2 | 7/2014 | Kim |
| 8,791,497 B2 | 7/2014 | Park et al. |
| 2005/0139846 A1 | 6/2005 | Park et al. |
| 2012/0267663 A1 | 10/2012 | Park et al. |
| 2012/0313125 A1* | 12/2012 | Odnoblyudov ....... H01L 33/502 257/98 |
| 2013/0181243 A1* | 7/2013 | Wu ....................... H01L 33/505 257/98 |
| 2013/0193464 A1* | 8/2013 | Bae ...................... H01L 33/405 257/94 |
| 2013/0200413 A1* | 8/2013 | Kashiwagi ............. H01L 33/50 257/98 |
| 2013/0307003 A1* | 11/2013 | Park ...................... H01L 33/46 257/98 |
| 2015/0221835 A1* | 8/2015 | Tischler ................ H01L 25/165 438/27 |

FOREIGN PATENT DOCUMENTS

| | | |
|---|---|---|
| KR | 10-0961770 B1 | 6/2010 |
| KR | 10-2011-0131380 A | 12/2011 |
| KR | 10-2012-0107271 A | 10/2012 |
| KR | 10-1289073 B1 | 7/2013 |
| KR | 10-1374700 B1 | 3/2014 |

\* cited by examiner

LIGHT-EMITTING APPARATUS AND LIGHT-EMITTING MODULE INCLUDING THE SAME

CROSS-REFERENCE TO RELATED APPLICATION

This application claims priority from Korean Patent Application No. 10-2015-0098410, filed on Jul. 10, 2015, in the Korean Intellectual Property Office, the disclosure of which is incorporated herein in its entirety by reference.

BACKGROUND

Apparatuses consistent with exemplary embodiments relate to a light-emitting apparatus, and more particularly, to a light-emitting apparatus having reduced manufacturing cost and improved optical quality.

In general, in a light-emitting device package, a light-emitting device chip is mounted in a package including a lead frame. In this case, a size of the package itself increases, and manufacturing cost of the light-emitting device package also increases. Accordingly, a flip chip technology for electrically connecting electrodes of a light-emitting device directly to a circuit board without using the lead frame has been used. However, blue light generated by the light-emitting device may leak from a light-emitting apparatus and fail to be converted into white light, and as a result, may be emitted as blue light.

SUMMARY

One or more exemplary embodiments provide a light-emitting apparatus having reduced manufacturing cost and improved optical quality.

One or more exemplary embodiments provide a light-emitting module including the light-emitting apparatus.

According to an aspect of an exemplary embodiment, there is provided a light-emitting apparatus including a reflective layer including a cavity that penetrates the reflective layer from a top surface to a bottom surface of the reflective layer, a light-emitting device disposed in the cavity and including a light-emitting stack and an electrode connected to the light-emitting stack at a bottom surface of the light-emitting stack, and a wavelength conversion layer that fills the cavity and covers at least one of a top surface and a side surface of the light-emitting device, wherein the wavelength conversion layer exposes at least a portion of the electrode to an outside.

The reflective layer may include a sloped portion at an inner side surface of the reflective layer, which contacts the wavelength conversion layer.

The reflective layer may further include a bottom portion connected to an end portion of the sloped portion and extending in a direction parallel to the bottom surface of the reflective layer.

The reflective layer may include a white silicone sheet.

The apparatus may further include a reflective film on an inner side surface of the reflective layer.

The wavelength conversion layer may include an adhesive layer and a phosphor film disposed on the adhesive layer, wherein a bottom surface of the adhesive layer may be at a level identical to that of the bottom surface of the reflective layer, and a top surface of the adhesive layer may be at a level identical to or higher than that of a top surface of the light-emitting device.

The apparatus may further include a lens layer on the reflective layer.

A bottom surface of the wavelength conversion layer and the bottom surface of the reflective layer may provide a bottom surface of the light-emitting apparatus.

The light-emitting stack may include a first conductive-type semiconductor layer, an active layer, and a second conductive-type semiconductor layer.

Light generated by the light-emitting stack may be controlled to travel towards a top surface of the light-emitting apparatus.

According to another aspect of an exemplary embodiment, there is provided a light source module including a circuit board including a connection pad on a surface of the circuit board, and a light-emitting apparatus mounted on the circuit board, wherein the light-emitting apparatus includes: a reflective layer including a cavity that penetrates the reflective layer from a top surface to a bottom surface of the reflective layer; a light-emitting device disposed in the cavity and including a light-emitting stack and an electrode connected to the light-emitting stack at a bottom surface of the light-emitting stack; and a wavelength conversion layer that fills the cavity and covers at least one of a top surface and a side surface of the light-emitting device, the wavelength conversion layer exposing at least a portion of the electrode to an outside, and the electrode is connected to the connection pad.

A bottom surface of the wavelength conversion layer and the bottom surface of the reflective layer may provide a bottom surface of the light-emitting apparatus.

The reflective layer may include a white silicone sheet.

The light-emitting stack may include a first conductive-type semiconductor layer, an active layer, and a second conductive-type semiconductor layer, and the electrode may include a first electrode connected to the first conductive-type semiconductor layer and a second electrode connected to the second conductive-type semiconductor layer.

An area of a top surface of the cavity may be greater than an area of a bottom surface of the cavity.

The electrode may be connected to the connection pad in a flip chip manner.

According to still another aspect of an exemplary embodiment, there is provided light-emitting apparatus including: a light-emitting stack including a first conductive-type semiconductor layer, an active layer, and a second conductive-type semiconductor layer; a wavelength conversion layer at least a portion of which is disposed above the light-emitting stack and configured to convert a wavelength of at least some of light, emitted from the active layer and having a first wavelength, into a second wavelength; and a reflective layer that surrounds at least side surfaces of the wavelength conversion layer.

A bottom surface of the light-emitting stack may be positioned at a level higher than a level of a bottom surface of the reflective layer.

The light-emitting apparatus may further include an electrode connected to the light-emitting stack at the bottom surface of the light-emitting stack, wherein the electrode is exposed to an outside.

The reflective layer may include an inclined portion that is inclined relative to a top surface of the reflective layer, the inclined portion contacting the wavelength conversion layer.

BRIEF DESCRIPTION OF THE DRAWINGS

The above and/or other aspects will be more apparent by describing certain example embodiments with reference to the accompanying drawings in which.

DETAILED DESCRIPTION

Figure 1A:
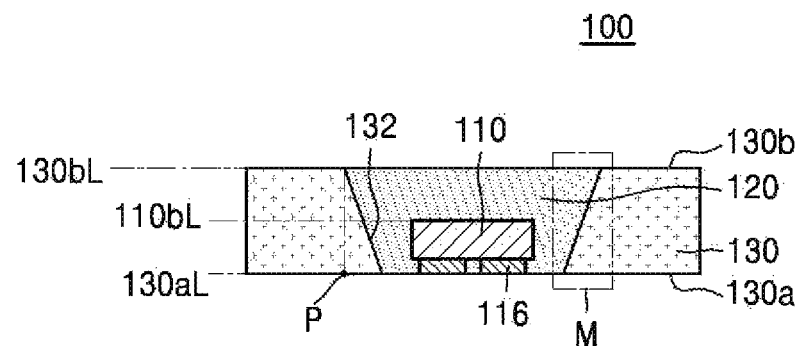
FIG. 1A is a side cross-sectional view of a light-emitting apparatus according to an exemplary embodiment.

Hereinafter, exemplary embodiments of the inventive concept will be described with reference to the accompanying drawings. The inventive concept may, however, be embodied in many different forms and should not be construed as being limited to the exemplary embodiments set forth herein; rather, these exemplary embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. In the drawings, the dimensions of structures are exaggerated for clarity of the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, exemplary embodiments of the inventive concept will be described with reference to the accompanying drawings. In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes. The following exemplary embodiments may be combined.

A light-emitting apparatus described herein may have various configurations. Only example configurations thereof are illustrated herein, and exemplary embodiments are not limited thereto.

Figure 1B:
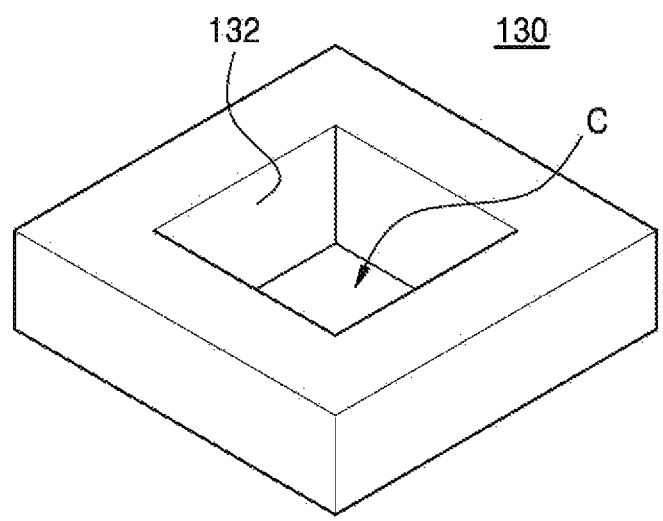
FIG. 1B is a perspective view of a reflective layer according to an exemplary embodiment.
Figure 1C:
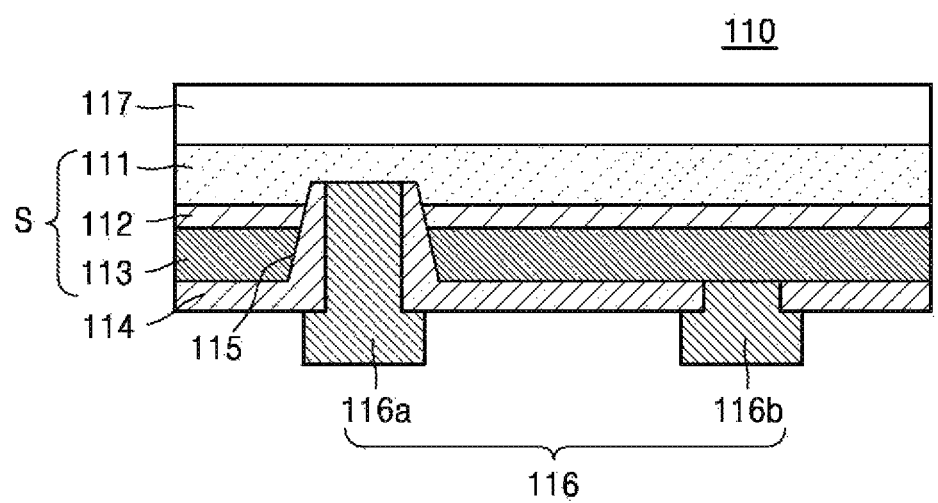
FIG. 1C is a side cross-sectional view of a light-emitting device according to an exemplary embodiment.

FIG. 1A is a side cross-sectional view of a light-emitting apparatus 100 according to an exemplary embodiment, FIG. 1B is a perspective view of a reflective layer 130, and FIG. 1C is a side cross-sectional view of a light-emitting device 110.

Referring to FIGS. 1A to 1C, the light-emitting apparatus 100 may include the reflective layer 130 in which a cavity C penetrating the reflective layer 130 from a top surface 130b of the reflective layer 130 to a bottom surface 130a of the reflective layer 130 is formed, a light-emitting device 110 disposed in the cavity C and including a light-emitting stack S and an electrode 116 connected to the light-emitting stack S at a bottom surface of the light-emitting stack S, and a wavelength conversion layer 120 filling the cavity C and covering a top surface and a side surface of the light-emitting device 110.

The light-emitting device 110 may include a transparent supporting substrate 117, the light-emitting stack S, and a first electrode 116a and a second electrode 116b disposed at the bottom surface of the light-emitting stack S. Also, the light-emitting device 110 may include an insulating portion 114 that covers at least a portion of the first and second electrodes 116a and 116b. The light-emitting stack S may include a first conductive-type semiconductor layer 111, an active layer 112, and a second conductive-type semiconductor layer 113. The first electrode 116a may penetrate the second conductive-type semiconductor layer 113 and the active layer 112 to be provided as a conductive via connected to the first conductive-type semiconductor layer 111. The second electrode 116b may be connected to the second conductive-type semiconductor layer 113.

The light-emitting stack S may be a stacked structure including the first conductive-type semiconductor layer 111, the active layer 112, and the second conductive-type semiconductor layer 113. The first and second conductive-type semiconductor layers 111 and 113 may respectively include semiconductors doped with p-type and n-type impurities. Alternatively, the first and second conductive-type semiconductor layers 111 and 113 may respectively include semiconductors doped with n-type and p-type impurities. The first and second conductive-type semiconductor layers 111 and 113 may include a nitride semiconductor, for example, $Al_xIn_yGa(1-x-y)N (0<x<1, 0<y<1, 0<x+y<1)$. Alternatively, the first and second conductive-type semiconductor layers 111 and 113 may include a GaAs-based semiconductor or a GaP-based semiconductor. The first conductive-type semiconductor layer 111, the active layer 112, and the second conductive-type semiconductor layer 113 may be epitaxial layers.

The active layer 112 disposed between the first and second conductive-type semiconductor layers 111 and 113 may emit light having predetermined energy through recombination of electrons and holes. The active layer 112 may have a multi-quantum well (MQW) structure, for example, a InGaN/GaN or AlGaN/GaN structure, in which a quantum well layer and a quantum barrier layer are alternately stacked. Alternatively, the active layer 112 may have a single-quantum well (SQW) structure. Depending on the material of a compound semiconductor used to form the light-emitting stack S, blue light, green light, red light, ultraviolet rays, or the like is emitted.

The first and second conductive-type semiconductor layers 111 and 113 may be respectively connected to the first and second electrodes 116a and 116b. For example, the first conductive-type semiconductor layers 111 may be exposed via a penetrating hole 115 penetrating the second conductive-type semiconductor layer 113 and the active layer 112. The first electrode 116a is formed in a space that is defined by the insulating portion 114 in the penetrating hole 115 to be connected to the first conductive-type semiconductor layer 111. The insulating portion 114 is formed on an inner side wall of the penetrating hole 115 and on a bottom surface of the second conductive-type semiconductor layer 113 to prevent electrical connection between the first electrode 116a and the active layer 112, the second conductive-type semiconductor layer 113, and the second electrode 116b. Also, the second electrode 116b may penetrate the insulating portion 114 on the second conductive-type semiconductor layer 113 and thus may be connected to the second conductive-type semiconductor layer 113.

A conductive material is deposited on the light-emitting stack S to form the first and second electrodes 116a and 116b. Each of the first and second electrodes 116a and 116b may be an electrode including at least one of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Ir), ruthenium (Ru), magnesium (Mg), zinc (Zn), and an alloy thereof. For example, the second electrode 116b may include an Ag layer, which forms an electrical ohmic contact with the second conductive-type semiconductor layer 113, and is stacked on the second conductive-type semiconductor layer 113. The Ag ohmic electrode of the second electrode 116b also serves as a light-reflecting layer. Single layers, each selected from Ni, Ti, Pt, and W, or an alloy layer thereof may be selectively and alternately stacked on the Ag layer. For example, Ni/Ti layer, TiW/Pt layer, or Ti/W layer may be stacked under an Ag layer, or the above layers may be alternately stacked under the Ag layer. The first electrode 116a may include a Cr layer stacked on the first conductive-type semiconductor layer 111, and Au/Pt/Ti layers may be sequentially stacked on the Cr layer.

In addition to forming electrical ohmic contacts with the first conductive-type semiconductor layer 111 and the second conductive-type semiconductor layer 113, respectively, the first and second electrodes 116a and 116b may include a light-reflecting material and thus may effectively emit light emitted from the active layer 112 towards the first conductive-type semiconductor layer 111 in a state where the light-emitting device 110 is mounted in a flip-chip structure. However, according to a main light-emission direction, the second electrode 116b may include a light-transmitting conductive material such as a transparent conductive oxide.

Various materials or stacked structures other than those described in the above exemplary embodiment may be applied to the first and second electrodes 116a and 116b to improve ohmic characteristics and/or reflection characteristics thereof.

The insulating portion 114 may include an open area for exposing at least a portion of the first and second electrodes 116a and 116b, and may have $SiO_2$ and/or SiN deposited to have about 0.01 μm to about 3 μm thickness.

The first and second electrodes 116a and 116b may be electrically separated from each other by the insulating portion 114. The insulating portion 114 may include any type of electrically insulative material that has a low light absorption rate, for example, silicon oxide or silicon nitride, such as $SiO_2$, $SiO_xN_y$, or $Si_xN_y$. In an exemplary embodiment, a light-reflecting filler may be dispersed in a light-transmitting material to form a light-reflecting structure.

Any transparent material may be used to form the transparent supporting substrate 117. Glass, for example, may be used for the transparent supporting substrate 117. Also, a material having excellent light-transmitting properties, such as silicone, epoxy, or plastic, may be used to form the transparent supporting substrate 117.

While the first conductive-type semiconductor layer 111, the active layer 112, the second conductive-type semiconductor layer 113, the first electrode 116a, the insulating portion 114, and the second electrode 116b illustrated in FIG. 1C illustrate an electrical connection structure of the light-emitting stack S and the electrode 116, exemplary embodiments are not limited thereto. In some embodiments, the light-emitting stack S may be a device emitting light having predetermined energy, and the electrode 116 may have various structures for transferring energy to the light-emitting stack S.

The cavity C penetrating the reflective layer 130 from the top surface 130b to the bottom surface 130a may be formed in the reflective layer 130, and the light-emitting device 110 may be disposed in the cavity C. The wavelength conversion layer 120 may be in contact with an inner side surface of the reflective layer 130 in the cavity C and may surround the light-emitting device 110 while exposing at least a portion of the electrode 116. Although it is illustrated in FIG. 1B that the shape of a cross-sectional plane of the cavity C parallel to the top surface 130b of the reflective layer 130 is a quadrangle, the shape of the cross-sectional plane is not limited thereto. For example, the shape of the cross-sectional plane may be a circle.

The reflective layer 130 may serve as a reflector to efficiently emit light from the light-emitting device 110 to the outside.

The reflective layer 130 may include a sloped portion 132 at the inner side surface of the reflective layer 130, which is in contact with the wavelength conversion layer 120. The sloped portion 132 may be inclined so that light emitted from the light-emitting device 110 and travelling towards a side surface of the light-emitting apparatus 100 is reflected and emitted toward a top surface 130b of the light-emitting apparatus 100. The sloped portion 132 extends from a top point of the reflective layer 130 (or a top point of sloped portion 132), where the top surface 130b of the reflective layer 130 meets the cavity C, to the bottom of the reflective layer 130, where the bottom surface 130a of the reflective layer 130 meets the cavity C. In this regard, a point P at which a vertical line extending from the top point of the sloped portion 132 in a direction perpendicular to the top surface 130b of the reflective layer 130 meets the bottom surface 130a of the reflective layer 130 is located farther from the light-emitting device 110 than the bottom of the sloped portion 132 is. That is, a cross section area of an upper portion of the cavity C may be greater than that of a cross section area of a lower portion of the cavity C.

Particularly, blue light emitted from a blue light-emitting device may have characteristics of white light as the blue light passes through a wavelength conversion material such as a phosphor. The reflective layer 130 may reflect blue light emitted towards a side surface of the light-emitting apparatus 100 and thus may change a travelling direction of the blue light so that the blue light may again pass through the wavelength conversion layer 120. Also, in this manner, the blue light may be prevented from failing to be converted into white light and prevented from leaking out of the light-emitting apparatus 100.

Although, in some embodiments, the reflective layer 130 may include a white silicone sheet, a material of the reflective layer 130 is not limited thereto. White-colored epoxy resin, acrylic resin, urethane resin, and the like may be used individually or together, and the above-described resin and a metal such as iron or nickel may be used together.

In some embodiments, a bottom surface of the wavelength conversion layer 120 filling the cavity C and a bottom surface 130a of the reflective layer 130 may form a bottom surface of the light-emitting apparatus 100. Accordingly, the light-emitting stack S may be located at a level higher than a level 130aL of the bottom surface 130a of the reflective layer 130. The light-emitting stack S is located at a level higher than the level 130aL of the bottom surface 130a of the reflective layer 130, and therefore, although light emitted from the light-emitting stack S may travel toward a side surface of the light-emitting apparatus 100, the light may be reflected by the reflective layer 130. Accordingly, blue light emitted from the light-emitting stack S may be prevented from failing to be converted into white light and prevented from leaking out of the light-emitting apparatus 100.

The wavelength conversion layer 120 may be formed in the cavity C in the reflective layer 130 to convert a wavelength of light emitted from the light-emitting device 110. The wavelength conversion layer 120 may be a phosphor, and in an exemplary embodiment, the wavelength conversion layer 120 may be formed in the cavity C through a dispensing process. Also, the wavelength conversion layer 120 may include resin including a wavelength conversion material such as a quantum dot. The wavelength conversion layer 120 may be excited by light emitted from the light-emitting stack S to convert at least a portion of the light into light having a different wavelength. The wavelength conversion material may include two or more different materials to provide beams of light having different wavelengths from each other. A wavelength of light generated from the light-emitting stack S may be converted via the wavelength conversion layer 120 and thus, the light may be output as white light. A detailed material of the wavelength conversion layer 120 will be described with reference to FIGS. 12 and 13.

The wavelength conversion layer 120 may cover the top surface and the side surface of the light-emitting device 110 and may expose at least a portion of the electrode 116 to the outside while covering at least a portion of a bottom surface of the light-emitting device 110.

In exemplary embodiments, the light-emitting apparatus 100 may be mounted onto a printed circuit board without using a lead frame. That is, without a connection structure such as a metal wire, the electrode 116 may be attached to a chip pad of the printed circuit board to be electrically connected thereto. Accordingly, a space for metal wire connection is unnecessary and therefore, the light-emitting apparatus 100 having a small size may be manufactured. Also, a mold for protecting a metal wire is not formed. Accordingly, problems such as luminance degradation and product damage due to the exposure of a mold to heat may not occur. Thus, a reliable product may be provided.

Figure 2:
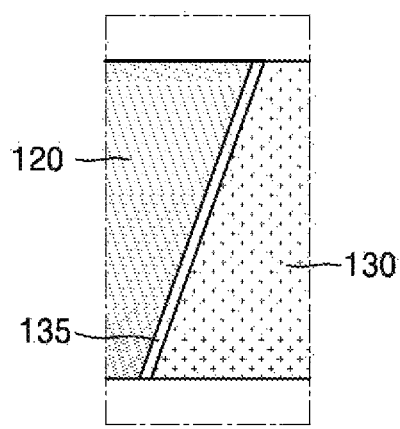
FIG. 2 is an enlarged view of area M of FIG. 1A.

FIG. 2 is an enlarged view of area M of FIG. 1A.

Referring to FIG. 2, the reflective layer 130 may further include a reflective film 135 on the inner side surface of the reflective layer 130, and the reflecting film 135 may improve a reflection efficiency of the reflective layer 130 serving as a reflector. A material of the reflecting film 135 may be selected from materials to improve the reflection efficiency of the reflective layer 130. For example, the reflecting film 135 may include $TiO_2$ film, and $TiO_2$, which is a white material, may improve the reflection efficiency of the reflective layer 130. By using a method such as spray coating, the $TiO_2$ film may be formed on a surface of resin in a form of a plate in which the cavity C is formed.

Figure 3:
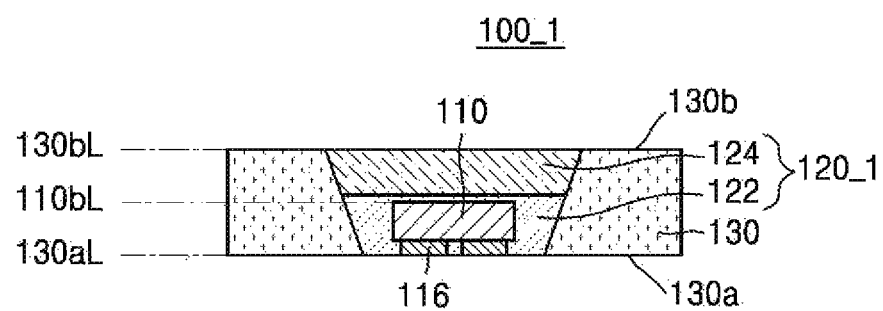
FIG. 3 is a side cross-sectional view of a light-emitting apparatus according to an exemplary embodiment.

FIG. 3 is a side cross-sectional view of a light-emitting apparatus 100_1 according to an exemplary embodiment. The light-emitting apparatus 100_1 of FIG. 3 is similar to the light-emitting apparatus 100 of FIG. 1A, except that a wavelength conversion layer 120_1 has different configurations from its corresponding element of FIG. 1A. Descriptions having already been provided with reference to FIG. 1A will be simply reiterated or omitted.

Referring to FIG. 3, the light-emitting apparatus 100_1 may include the reflective layer 130 in which the cavity C penetrating the reflective layer from the top surface 130*b* to the bottom surface 130*a* of the reflective layer 130 is formed, the light-emitting device 110 disposed in the cavity C and including the light-emitting stack S and the electrode 116 connected to the light-emitting stack S at the bottom surface of the light-emitting stack S, and the wavelength conversion layer 120_1 filling the cavity C and covering a top surface and a side surface of the light-emitting device 110.

The wavelength conversion layer 120_1 may include an adhesive layer 122, a bottom surface of which is at a level identical to the level 130*a*L of the bottom surface 130*a* of the reflective layer 130, and a top surface of which is at a level identical to or greater than a level 110*b*L of a top surface of the light-emitting device 110, and a phosphor film 124 formed on the adhesive layer 122. The phosphor film 124 may have been previously manufactured and attached on the adhesive layer 122.

Although it is illustrated in FIG. 3 that the bottom surface of the adhesive layer 122 is at a level identical to the level 130*a*L of the bottom surface 130*a* of the reflective layer 130 and the top surface of the adhesive layer 122 is at a level adjacent to the level 110*b*L of the top surface of the light-emitting device 110, the adhesive layer 122 may extend up to a level identical to a level 130*b*L of the top surface 130*b* of the reflective layer 130. In this case, the phosphor film 124 may cover the top surface 130*b* of the reflective layer 130.

Figure 4:
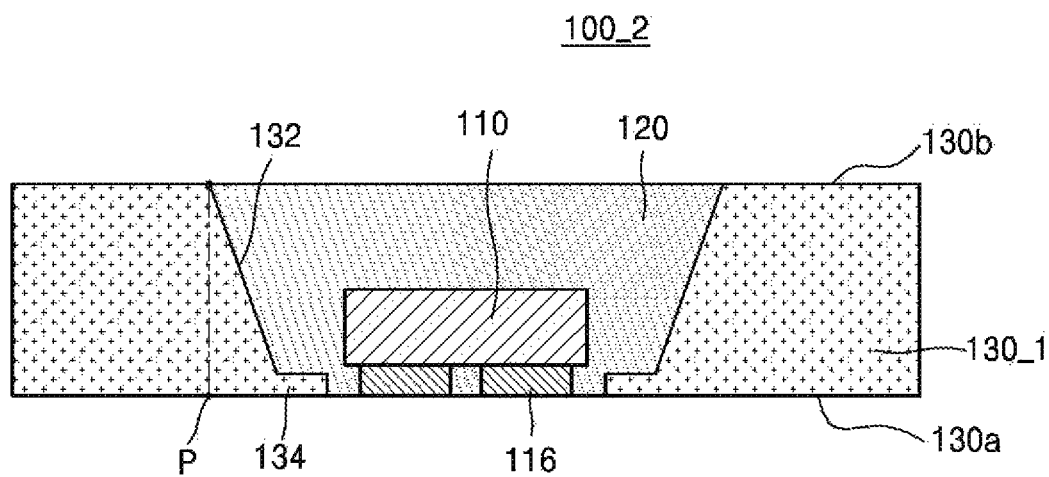
FIG. 4 is a side cross-sectional view of a light-emitting apparatus according to an exemplary embodiment.

FIG. 4 is a side cross-sectional view of a light-emitting apparatus 100_2 according to an exemplary embodiment. The light-emitting apparatus 100_2 of FIG. 4 is similar to the light-emitting apparatus 100 of FIG. 1A, except that a reflective layer 130_1 has different configurations from its corresponding element of FIG. 1A. Descriptions having already been provided with reference to FIG. 1A will be simply reiterated omitted.

Referring to FIG. 4, the reflective layer 130_1 may include a bottom portion 134 connected to an end portion of the sloped portion 132 at an inner side surface of the reflective layer 130_1, which is in contact with the wavelength conversion layer 120. The sloped portion 132 extends from the top point of the reflective layer 130_1 (or the top point of sloped portion 132), where the top surface 130*b* of the reflective layer 130_1 meets the cavity C, to the bottom point of the reflective layer 130_1, where the bottom surface 130*a* of the reflective layer 130_1 meets the cavity C. In this regard, the point P at which a vertical line extending from the top point of the sloped portion 132 in a direction perpendicular to the top surface 130*b* of the reflective layer 130_1 meets the bottom surface 130*a* of the reflective layer 130_1 is located farther from the light-emitting device 110 than the bottom of the sloped portion 132 is.

The bottom portion 134 may be connected to the end portion of the sloped portion 132 and may extend parallel to the bottom surface 130*a* of the reflective layer 130_1. The bottom portion 134, along with the sloped portion 132, may reflect light emitted from the light-emitting device 110 so that the light may be emitted towards the top surface of the light-emitting apparatus 100_2. Particularly, although light emitted from the light-emitting device 110 and/or light reflected by the sloped portion 132 may travel towards a lower portion of the light-emitting apparatus 100_2, the light may be reflected by the bottom portion 134. Accordingly, the light may be prevented from leaking from the light-emitting apparatus 100_2 and may not be emitted without being converted by the wavelength conversion layer 120.

Figure 5:
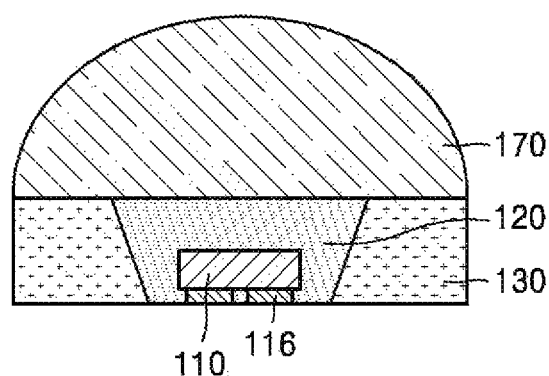
FIG. 5 is a side cross-sectional view of a light-emitting apparatus according to an exemplary embodiment.

FIG. 5 is a side cross-sectional view of a light-emitting apparatus 100_3 according to an exemplary embodiment.

Referring to FIG. 5, in comparison with FIG. 1A, the light-emitting apparatus 100_3 may further include a lens layer 170 formed on a top surface of the reflective layer 130.

A material having excellent light-transmitting properties and heat-resisting properties, for example, silicone, epoxy, glass, or plastic, may be used to form the lens layer 170. The lens layer 170, which is an optical member, may adjust a beam angle of light emitted through a top surface of the lens layer 170 by using a convex or concave lens structure. A material of the lens layer 170 may be selected from resins having high transparency, through which light emitted from the light-emitting device 110 may pass with a minimum loss. For example, elastic resin, silicone, epoxy resin, or plastic may be used. The lens layer 170 may be directly formed on the reflective layer 130, for example, by using spray coating.

Although the lens layer 170 may have a dome-shaped structure having a convex top surface, exemplary embodiments are not limited thereto. The top surface of the lens layer 170 may have a dent in the center, the lens layer 170 may have an aspherical and/or asymmetric shape, or the top surface of the lens layer 170 may have an uneven portion.

Figure 6:
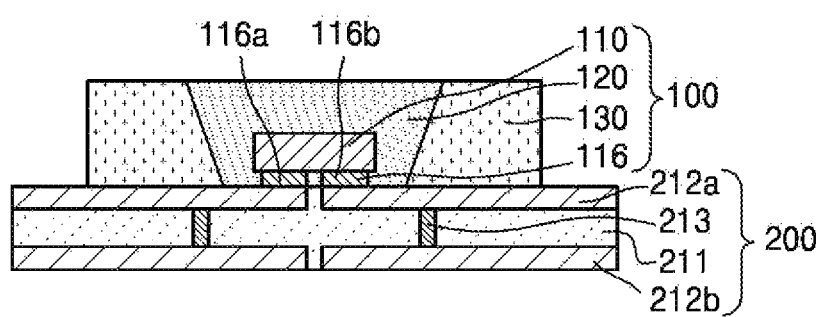
FIG. 6 is a side cross-sectional view of a light source module including a light-emitting apparatus, according to an exemplary embodiment.

FIG. 6 is a side cross-sectional view of a light source module 300 including the light-emitting apparatus 100, according to an exemplary embodiment.

Referring to FIG. 6 along with FIG. 2, the light source module 300 may include a circuit board 200 and the light-emitting apparatus 100 mounted on the circuit board 200. The circuit board 200 may include an upper connection pad 212*a* and a lower connection pad 212*b* respectively on a top surface and a bottom surface of a body 211, and a via 213 penetrating the body 211 to connect the upper connection pad 212*a* and the lower connection pad 212*b* to each other.

The body 211 may be resin or ceramic, and the upper connection pad 212a and the lower connection pad 212b may be metal layers, such as Au, Cu, Ag, or Al.

The light-emitting apparatus 100 may not use a connection structure such as a lead frame and be mounted to the circuit board 200 by connecting the first electrode 116a and the second electrode 116b to connection pads of the circuit board 200. Accordingly, cost for using the lead frame or the like may be avoided, processes may be simplified, and thus the overall cost may decrease.

However, the circuit board 200 is not limited to the configuration such as those described above, and any configuration in which a wire structure for driving the light-emitting apparatus 100 is formed may be applied to the circuit board 200.

Figure 7:
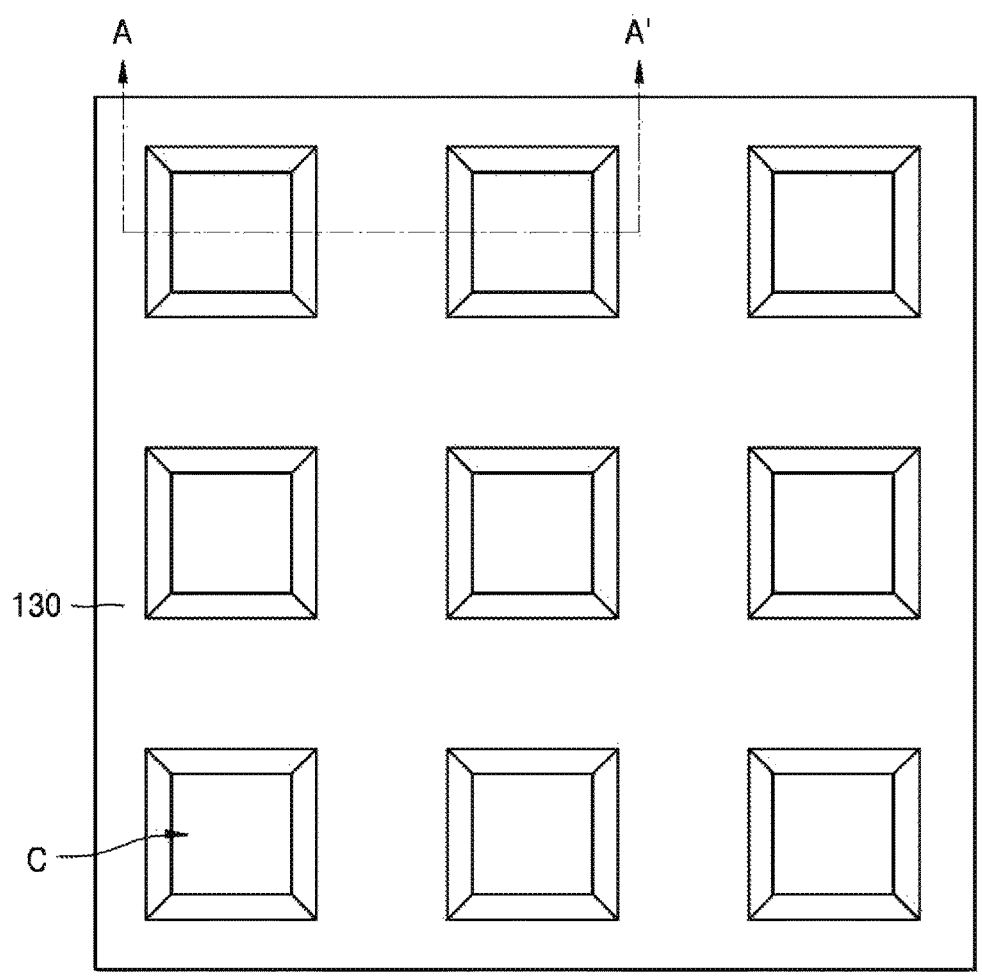
FIGS. 7 to 11 are diagrams illustrating a method of manufacturing the light-emitting apparatus of FIG. 1A.

FIGS. 7 to 11 are diagrams illustrating a method of manufacturing the light-emitting apparatus 100 of FIG. 1A. FIG. 7 is a plan view of the reflective layer 130, and FIGS. 8 to 11 are cross-sectional views sequentially illustrating a process of manufacturing the light-emitting apparatus 100, the process performed in an area taken along line A-A' of FIG. 7. Like reference numerals denote like elements, and repeated descriptions thereof will be omitted.

Figure 8:
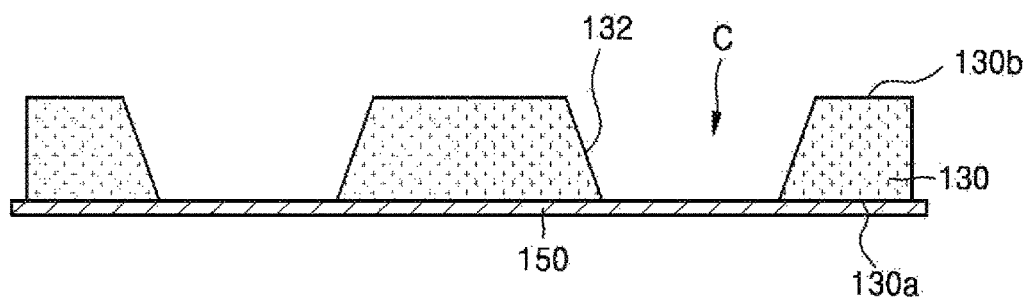

Referring to FIGS. 7 and 8, the reflective layer 130 in which a plurality of cavities C are formed is placed on a surface of a supporting body 150. Each of the cavities C may penetrate the reflective layer 130 from the top surface 130b to the bottom surface 130a of the reflective layer 130, and an inner side surface of the reflective layer 130 may include the sloped portion 132. The reflective layer 130 in a form of a plate in which the cavities C are formed may be a white silicone sheet and may be formed by using a molding process. However, a material of the reflective layer 130 is not limited thereto. Various materials of resins may be used instead of the white silicone sheet, and the reflective layer 130 including $TiO_2$ film on the inner side surface of the reflective layer 130 in which the cavities C are formed may be used.

The supporting body 150 may support the reflective layer 130 and may be formed, for example, by disposing an adhesive on a base film. The supporting body 150 may close an open portion at a bottom surface of the reflective layer 130 and thus may provide a space in which a light-emitting device and a wavelength conversion layer to be described below are formed in the cavity C.

Figure 9:
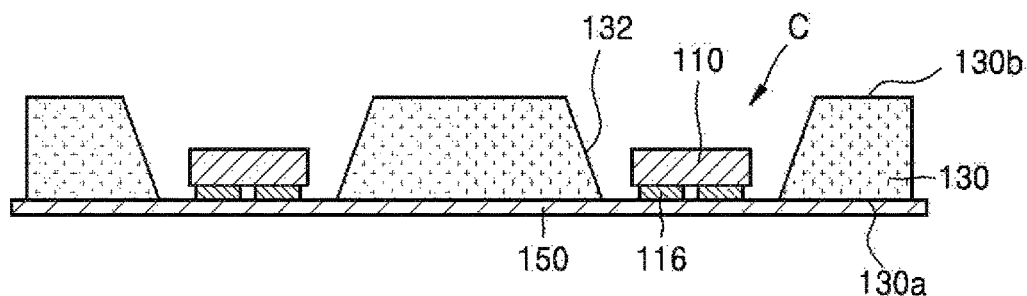

Referring to FIG. 9 along with FIG. 1C, the light-emitting device 110 is placed in each of the cavities C. In this regard, the light-emitting device 110 may be disposed such that the electrode 116 may be located on the supporting body 150. Accordingly, the light-emitting stack S generating light in the light-emitting device 110 may be located at a level higher than that of the bottom surface 130a of the reflective layer 130. Thus, although light travels from the light-emitting stack S in a direction of a side surface thereof or downwards, the reflective layer 130 may reflect the light and may further block the light from leaking out of the light-emitting apparatus 100.

Figure 10:
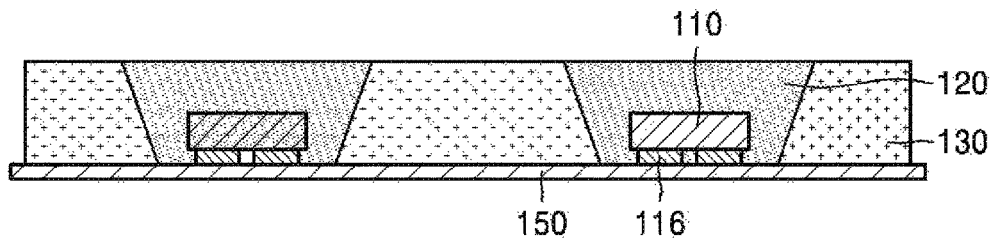

Referring to FIG. 10 along with FIG. 1C, the wavelength conversion layer 120 is formed in the cavity C. The wavelength conversion layer 120 may cover a top surface and a side surface of the light-emitting device 110 and may cover at least a portion of a bottom surface of the light-emitting device 110. Also, a side surface portion of the wavelength conversion layer 120 may be in contact with an inner side surface of the cavity C, and a bottom surface portion of the wavelength conversion layer 120 may be in contact with the supporting body 150. The wavelength conversion layer 120 may be formed by filling the cavity C with a wavelength conversion material, such as a phosphor, in a liquid state through a dispensing process and hardening the wavelength conversion material through a curing process. The wavelength conversion layer 120 may be filled in the cavity C while not covering a portion of the electrode 116 that is in contact with the supporting body 150, and accordingly, the portion of the electrode 116 may be exposed to the outside when the supporting body 150 is removed.

Figure 11:
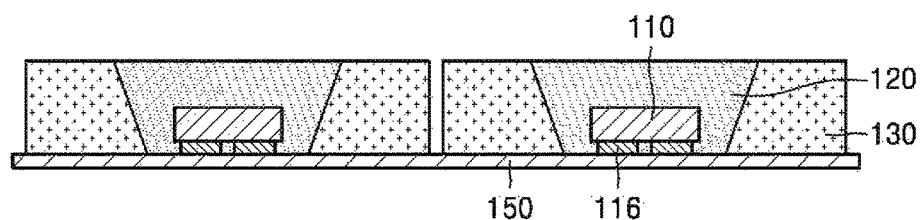

Referring to FIG. 11, adjacent light-emitting devices 110 may be diced and separated into individual light-emitting devices 110. When the supporting body 150 is removed thereafter, the light-emitting device 110 of FIG. 1A may be provided. Also, the electrode 116 may be exposed to the outside and thus may be electrically connected to a connection pad of a circuit board.

As above, FIGS. 7 to 11 illustrate a process of manufacturing the light-emitting apparatus 100. However, a method of manufacturing the light-emitting apparatus 100 according to one or more exemplary embodiments are not limited thereto.

Figure 12A:
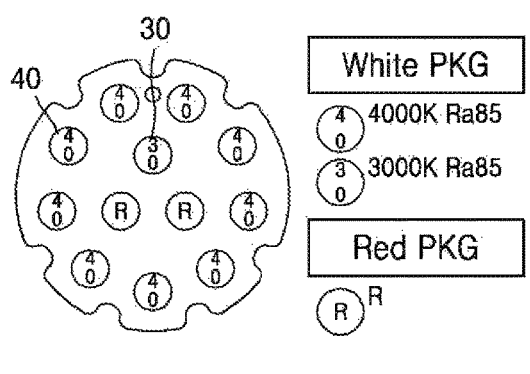
FIGS. 12A and 12B are schematic cross-sectional views of a white light source module, according to an exemplary embodiment.
Figure 12B:
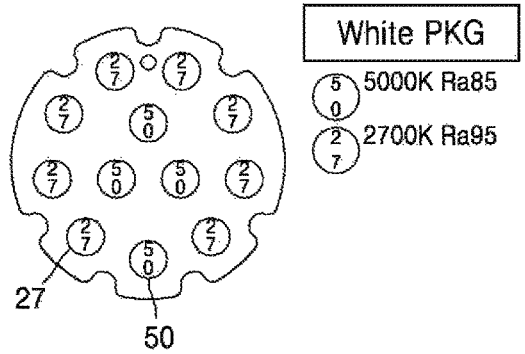
Figure 13:
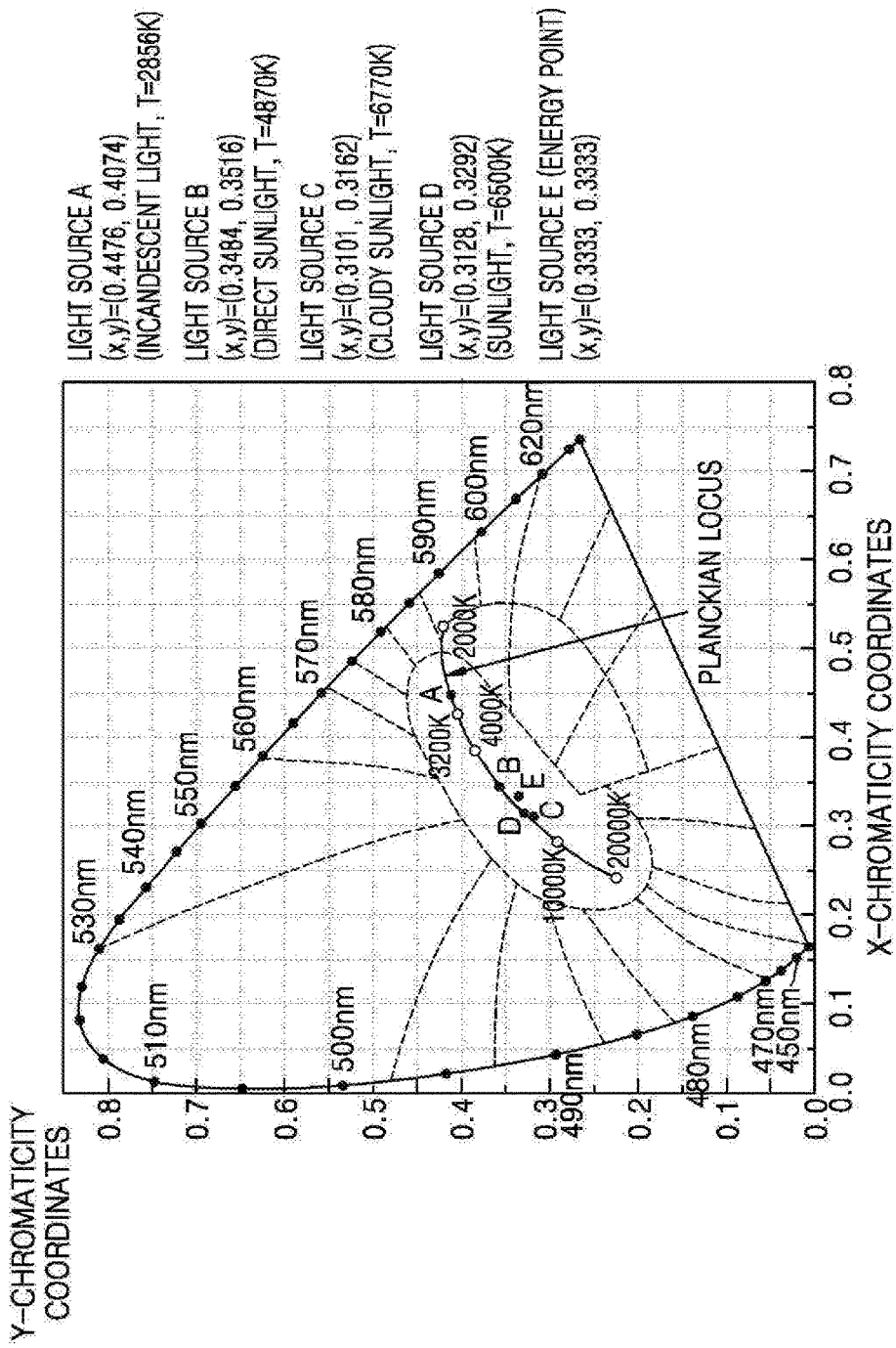
FIG. 13 is a CIE chromaticity diagram illustrating a perfect radiator spectrum that may be used for a light-emitting apparatus according to an exemplary embodiment.

FIGS. 12A and 12B are schematic cross-sectional views of a white light source module, which is adoptable in a lighting apparatus as a light-emitting apparatus, according to an exemplary embodiment, and FIG. 13 is a CIE chromaticity diagram illustrating a perfect radiator spectrum that is usable for a light-emitting apparatus manufactured by using the manufacturing method, according to an exemplary embodiment.

Specifically, light source modules illustrated in FIGS. 12A and 12B may respectively include a plurality of light-emitting apparatuses 30, 40, R, 27, and 50 mounted on a circuit board. The light-emitting apparatuses 30, 40, R, 27, and 50 may be the above-described light-emitting apparatus 100, 100_1, 100_2, or 100_3 according to the exemplary embodiment. A plurality of light-emitting apparatuses mounted on one light source module may be the same type of light-emitting apparatuses that generate light having the same wavelength. However, as in the present exemplary embodiment, the plurality of light-emitting apparatuses may be different types of light-emitting apparatuses that generate light having different wavelengths.

Referring to FIG. 12A, the white light source module may be a combination of the white light-emitting apparatuses 40 and 30 having a color temperature of 4,000 K and 3,0000 K and the red light-emitting apparatus R. The white light source module may adjust a color rendering index (CRI) in the range of about 3,000 K to about 4,000 K and provide white light having a CRI Ra of about 85 to about 100.

According to another exemplary embodiment, the white light source module includes only white light-emitting apparatuses, but some light-emitting apparatuses may include white light having different color temperatures. For example, as illustrated in FIG. 12B, it is possible to adjust a color temperature in the range of about 2,700 K to about 5,000 K and provide white light having a CRI Ra of about 85 to about 99 by combining the white light-emitting apparatuses 27 having a color temperature of about 2,700 K and the white light-emitting apparatuses 50 having a color temperature of about 5,000 K. The number of light-emitting apparatuses for each color temperature may be changed according to the basic color temperature setting value. For example, in a lighting apparatus, of which the basic color temperature setting value is around a color temperature of 4,000 K, the number of light-emitting apparatuses corresponding to the color temperature of 4,000 K may be larger than the number of light-emitting apparatuses corresponding to a color temperature of 3,000 K or the number of red light-emitting apparatuses.

Different types of light-emitting apparatuses may be light-emitting apparatuses emitting white light by combining a yellow, green, red, or orange-color phosphor in a blue light-emitting device, and the light-emitting apparatuses emitting white light may be configured to include at least one of violet, blue, green, red, and infrared light-emitting devices and adjust a color temperature and a CRI of the white light.

The single light-emitting apparatus may determine light of a desired color according to a wavelength of a light-emitting diode (LED) chip and a type and a combination ratio of phosphors. In the case of the white light, the color temperature and the CRI may be adjusted.

For example, when the LED chip emits blue light, the light-emitting apparatus including at least one of the yellow, green, and red phosphors may be configured to emit white light having various color temperatures according to a combination ratio of the phosphors. On the other hand, the light-emitting apparatus, in which the green or red phosphor is applied to the blue LED chip, may be configured to emit green or red light. The color temperature and the CRI of the white light may be adjusted by combining the light-emitting apparatus emitting the white light and the light-emitting apparatus emitting the green or red light. In addition, the light-emitting apparatus may include at least one of light-emitting devices emitting the violet, blue, green, red, and infrared light.

In this case, the lighting apparatus may adjust the CRI to a photovoltaic level in a sodium (Na) lamp. In addition, the lighting apparatus may generate a variety of white light having a color temperature of about 1,500 K to about 20,000 K. Depending on an embodiment, the lighting apparatus may adjust an illumination color according to a surrounding atmosphere or a mood by generating infrared light or visible light such as violet, blue, green, red, or orange color light. In addition, the lighting apparatus may generate light having a specific wavelength to promote the growth of plants.

The white light, which is generated by the combination of the yellow, green and red phosphors and/or the green and red light-emitting devices in the blue light-emitting device has two or more peak wavelengths. As illustrated in FIG. 13, (x, y) coordinates of the white light in the CIE 1931 coordinate system may be positioned within a line segment connecting coordinates (0.4476, 0.4074), (0.3484, 0.3516), (0.3101, 0.3162), (0.3128, 0.3292), and (0.3333, 0.3333). Alternatively, the (x, y) coordinates may be positioned in a region surrounded by the line segment and a black-body radiator spectrum. The color temperature of the white light is in the range of about 1,500 K to about 20,000 K. In FIG. 13, since the white light around point E (0.3333, 0.3333) under the black-body radiator spectrum (Planckian locus) is relatively weak in the light of the yellow-based component, it may be used as an illumination light source in a region in which a user may have a more vivid or fresh feeling than naked eyes. Therefore, an illumination product using the white light around point E (0.3333, 0.3333) under the black-body radiator spectrum (Planckian locus) may be suitable as lighting for shopping malls that sell groceries and clothes.

On the other hand, various materials, such as phosphors and/or quantum dots, may be used as a material for converting a wavelength of light emitted by the semiconductor light-emitting device.

The phosphor may have the following empirical formulas and colors.

Oxide-based: yellow and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color —SiAlON:Eu, yellow color $La_3Si_6O_{11}$:Ce, orange color —SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) Formula (1)

In Formula (1) of Table 1, Ln may be at least one element selected from the group consisting of group IIIa elements and rare-earth elements, and M may be at least one element selected from the group consisting of calcium (Ca), barium (Ba), strontium (Sr), and magnesium (Mg).

Fluoride-based: KSF-based red color $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$.

The composition of the phosphor needs to basically conform to stoichiometry, and the respective elements may be substituted by other elements included in the respective groups of the periodic table. For example, strontium (Sr) may be substituted by at least one selected from the group consisting of barium (Ba), calcium (Ca), and magnesium (Mg) of alkaline-earth group II, and Y may be substituted by at least one selected from the group terbium (Tb), lutetium (Lu), scandium (Sc), and gadolinium (Gd). In addition, europium (Eu), which is an activator, may be substituted by at least one selected from the group consisting of cerium (Ce), terbium (Tb), praseodymium (Pr), erbium (Er), and ytterbium (Yb) according to a desired energy level. The activator may be applied solely or a sub activator may be additionally applied for characteristic modification.

In particular, to improve the reliability at a high temperature and high humidity, the fluoride-based red phosphor may be coated with an Mn-free fluoride material or may further include an organic coating on the surface of the phosphor or the coated surface of the Mn-free fluoride material. In the case of the fluoride-based red phosphor, it is possible to implement a narrow half-width of about 40 nm or less unlike other phosphors. Thus, the fluoride-based red phosphor may be applied to a high-resolution television (TV) such as ultra high definition (UHD) TV.

Table 1 below shows types of phosphors according to applications of a white light-emitting device using a blue LED chip (about 440 nm to about 460 nm) or a ultra violet (UV) LED chip (about 380 nm to about 440 nm).

TABLE 1

| Usage | Phosphor | Usage | Phosphor |
|---|---|---|---|
| LED TV BLU | β-SiAlON:Eu2+ | Side View | $Lu_3Al_5O_{12}$:Ce3+ |
| | (Ca, Sr)AlSiN$_3$:Eu2+ | (Mobile, Note PC) | Ca-α-SiAlON:Eu2+ |
| | $L_3Si_6N_{11}$:Ce3+ | | $La_3Si_6N_{11}$:Ce3+ |
| | $K_2LiAl_3N_4$:Mn4+ | | (Ca, Sr)AlSiN$_3$:Eu2+ |
| | $SrLiAl_3N_4$:Eu | | $Y_3Al_5O_{12}$:Ce3+ |
| | $Ln_{4-x}(Eu_zM_{1-z})_xSi_{12-y}Al_yO_{3+x+y}N_{18-x-y}$ | | (Sr, Ba, Ca, Mg)2SiO4:Eu2+ |
| | ($0.5 \leq x \leq 3$, $0 < z < 0.3$, $0 < y \leq 4$) | | $K_2SiF_6$:Mn4+ |

TABLE 1-continued

| Usage | Phosphor | Usage | Phosphor |
|---|---|---|---|
| | $K_2TiF_6:Mn4+$ | | SrLiAl3N4:Eu |
| | NaYF4:Mn4+ | | $Ln_{4-x}(Eu_zM_{1-z})_xSi_{12-y}Al_yO_{3+x+y}N_{18-x-y}$ |
| | NaGdF4:Mn4+ | | ($0.5 \leq x \leq 3$, $0 < z < 0.3$, $0 < y \leq 4$) |
| | | | $K_2TiF_6:Mn4+$ |
| | | | NaYF4:Mn4+ |
| | | | NaGdF4:Mn4+ |
| Illumination | $Lu_3Al_5O_{12}:Ce3+$ | Electrical | $Lu_3Al_5O_{12}:Ce3+$ |
| | Ca-α-SiAlON:Eu2+ | Component | Ca-α-SiAlON:Eu2+ |
| | $La_3Si_6N_{11}:Ce3+$ | (Head Lamp, etc.) | $La_3Si_6N_{11}:Ce3+$ |
| | (Ca, Sr)AlSiN$_3$:Eu2+ | | (Ca, Sr)AlSiN$_3$:Eu2+ |
| | $Y_3Al_5O_{12}:Ce3+$ | | $Y_3Al_5O_{12}:Ce3+$ |
| | $K_2SiF_6:Mn4+$ | | $K_2SiF_6:Mn4+$ |
| | SrLiAl3N4:Eu | | SrLiAl3N4:Eu |
| | $Ln_{4-x}(Eu_zM_{1-z})_xSi_{12-y}Al_yO_{3+x+y}N_{18-x-y}$ | | $Ln_{4-x}(Eu_zM_{1-z})_xSi_{12-y}Al_yO_{3+x+y}N_{18-x-y}$ |
| | ($0.5 \leq x \leq 3$, $0 < z < 0.3$, $0 < y \leq 4$) | | ($0.5 \leq x \leq 3$, $0 < z < 0.3$, $0 < y \leq 4$) |
| | $K_2TiF_6:Mn4+$ | | $K_2TiF_6:Mn4+$ |
| | NaYF4:Mn4+ | | NaYF4:Mn4+ |
| | NaGdF4:Mn4+ | | NaGdF4:Mn4+ |

In addition, the wavelength conversion layer may include wavelength conversion materials such as a quantum dot (QD) by substituting phosphors with the quantum dot or combining phosphors with the quantum dot.

Figure 14:
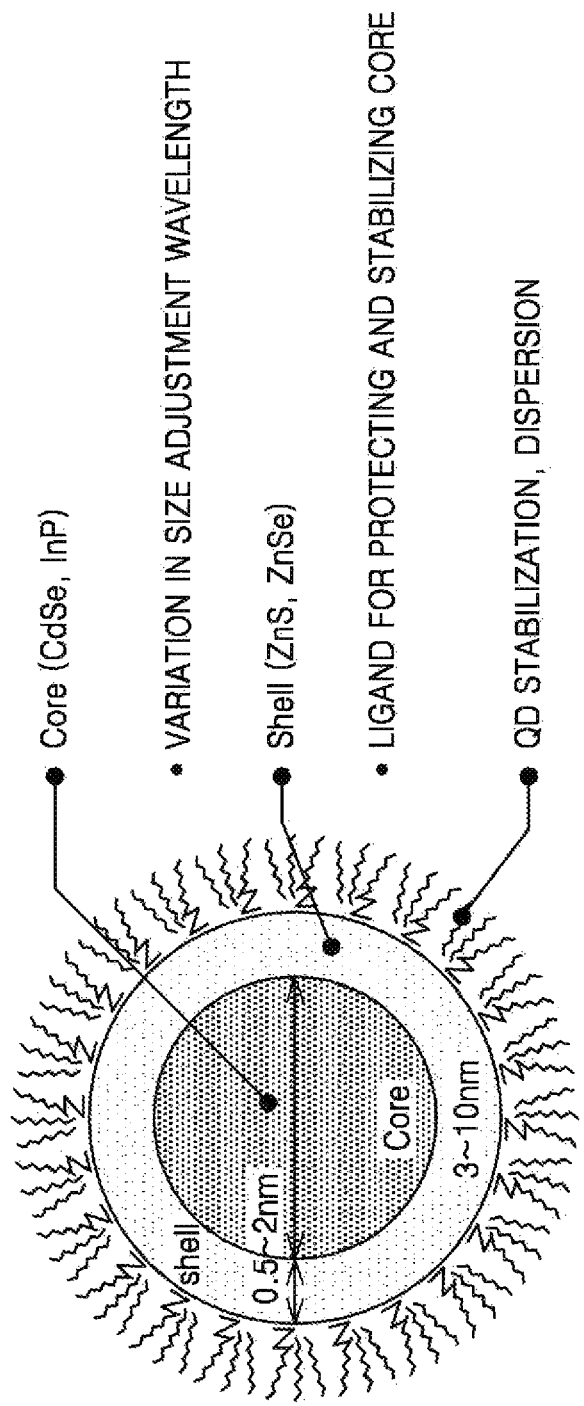
FIG. 14 is a schematic cross-sectional view of a quantum dot (QD) used as a wavelength conversion material for a light-emitting apparatus, according to an exemplary embodiment.

FIG. 14 is a schematic cross-sectional view of a QD used as a wavelength conversion material for a light-emitting apparatus, according to an exemplary embodiment.

Referring to FIG. 14, the QD may have a core-shell structure using group III-V or II-VI compound semiconductors. For example, the QD may have a core such as CdSe or InP and a shell such as ZnS or ZnSe. In addition, the QD may include a ligand for stabilizing the core and the shell. For example, the core may have a diameter of about 1 nm to about 30 nm and specifically, for example, about 3 nm to about 10 nm. The shell may have a thickness of about 0.1 nm to about 20 nm and specifically, for example, 0.5 nm to about 2 nm.

The QD may implement various colors according to a size. In particular, when the QD is used as a phosphor substitute, the QD may be used as a red or green phosphor. In the case of using the QD, a narrow half-width (for example, about 35 nm) may be implemented.

The wavelength conversion material may be implemented as being contained in an encapsulating material. However, the wavelength conversion material may be previously prepared in a film shape and be attached to a surface of an optical structure such as an LED chip or a light guide plate. In this case, the wavelength conversion material may be easily applied to a desired region in a structure having a uniform thickness.

Figure 15:
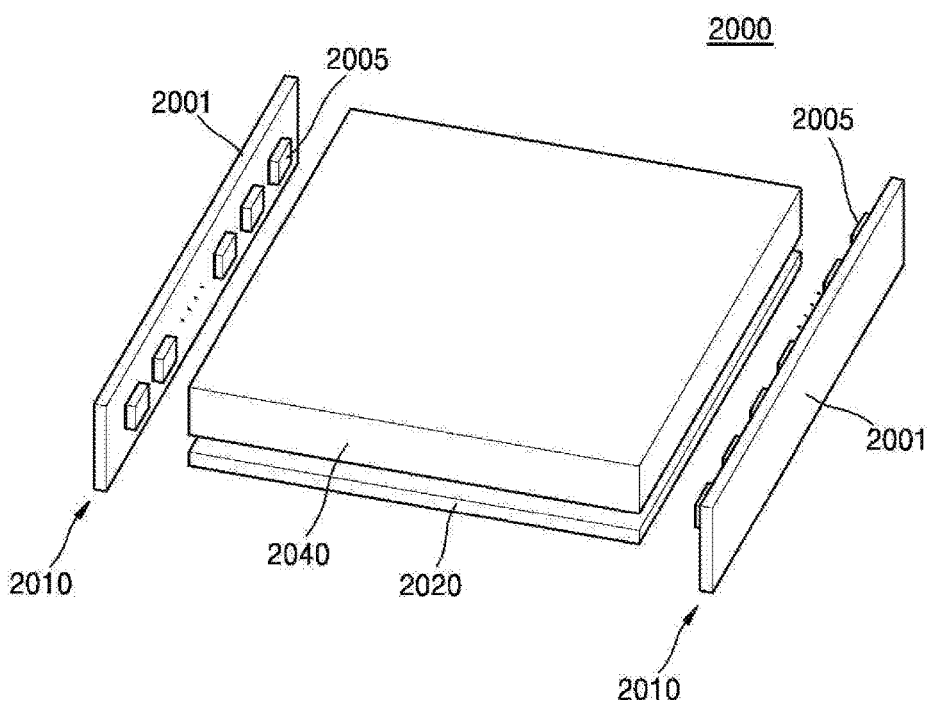
FIG. 15 is a schematic perspective view of a backlight unit including a light-emitting apparatus, according to an exemplary embodiment.

FIG. 15 is a schematic perspective view of a backlight unit 2000 including a light-emitting apparatus, according to an exemplary embodiment.

Referring to FIG. 15, the backlight unit 2000 may include a light guide plate 2040 and light source modules 2010 on both sides of the light guide plate 2040. In addition, the backlight unit 2000 may further include a reflective plate 2020 under the light guide plate 2040. The backlight unit 2000 according to the present exemplary embodiment may be an edge-type backlight unit. According to some exemplary embodiments, the light source module 2010 may be provided only one side of the light guide plate 2040 or may be additionally provided on the other side. The light source module 2010 may include a printed circuit board (PCB) 2001 and a plurality of light sources 2005 mounted on the PCB 2001. The light source 2005 may be the above-described light-emitting apparatus 100, 100_1, 100_2, or 100_3 according to the exemplary embodiment.

Figure 16:
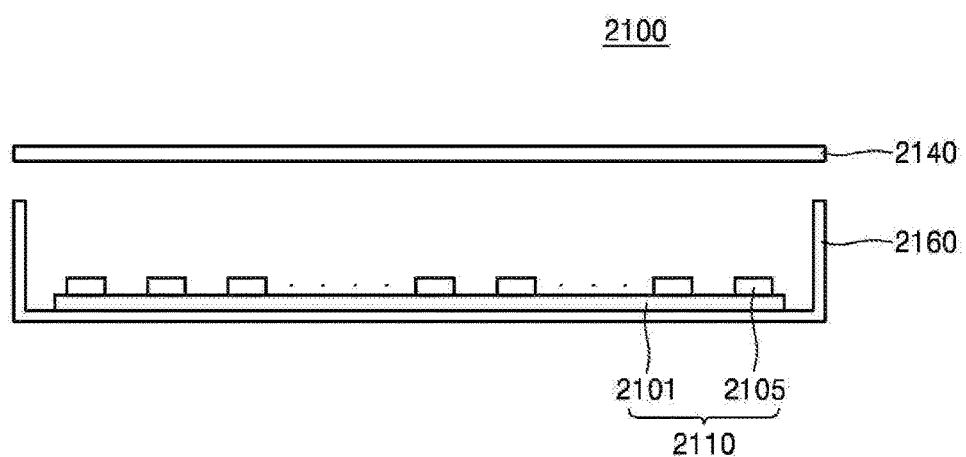
FIG. 16 illustrates a direct-type backlight unit including a light-emitting apparatus, according to an exemplary embodiment.

FIG. 16 illustrates a direct-type backlight unit 2100 including a light-emitting apparatus, according to an exemplary embodiment.

Referring to FIG. 16, the backlight unit 2100 may include a light diffusion plate 2140 and a light source module 2110 under the light diffusion plate 2140. In addition, the backlight unit 2100 may further include a bottom case 2160 under the light diffusion plate 2140 to accommodate the light source module 2110. The backlight unit 2100 according to the present exemplary embodiment may be a direct-type backlight unit.

The light source module 2110 may include a PCB 2101 and a plurality of light sources 2105 mounted on the PCB 2101. The light source 2105 may be the above-described light-emitting apparatus 100, 100_1, 100_2, or 100_3 according to the exemplary embodiment.

Figure 17:
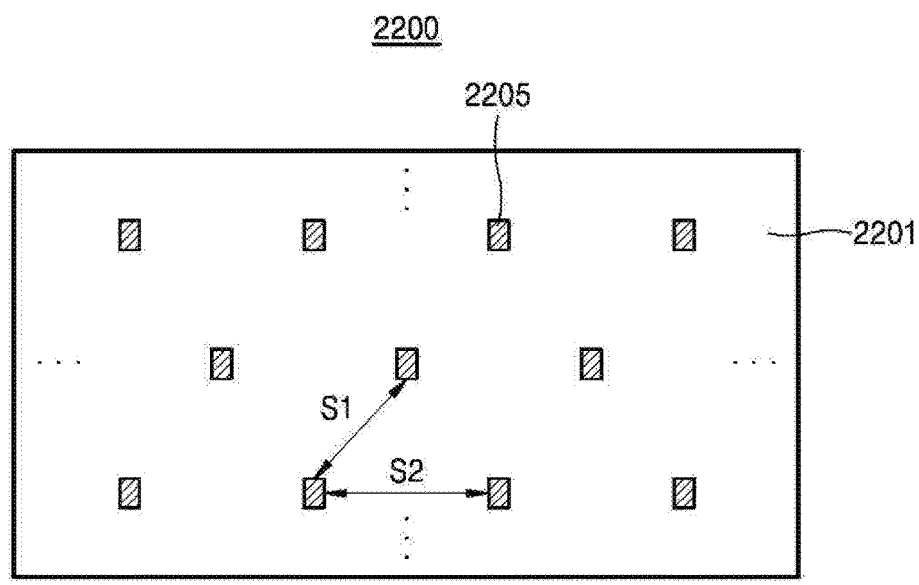
FIG. 17 illustrates a backlight unit including a light-emitting apparatus, according to an exemplary embodiment.

FIG. 17 illustrates a backlight unit 2200 including a light-emitting apparatus, according to an exemplary embodiment.

Specifically, FIG. 17 illustrates an example of an arrangement of a light source 2205 in a direct-type backlight unit 2200. The light source 2205 may be the above-described light-emitting apparatus 100, 100_1, 100_2, or 100_3 according to the exemplary embodiment.

The direct-type backlight unit 2200 according to the present exemplary embodiment may include a plurality of light sources 2205 arranged on a substrate 2201. The light sources 2205 may be arranged in a matrix form, of which rows and columns are in a zigzag arrangement. A second matrix having the same shape may be arranged in a first matrix in which the plurality of light sources 2205 are arranged in rows and columns on a straight line. It may be understood that the light sources 2205 included in the second matrix are inside a rectangle formed by four adjacent light sources 2205 included in the first matrix.

In the direct-type backlight unit, the arrangement structure and intervals of the first matrix and the second matrix may be different to further improve brightness uniformity and optical efficiency thereof. In addition to arranging the plurality of light sources, distances S1 and S2 between the adjacent light sources may be optimized to ensure the brightness uniformity. In this manner, the rows and columns on which the light sources 2205 are arranged may be in a zigzag arrangement, instead of the straight line, thus reducing the number of light sources 2205 by about 15% to about 25% with respect to the same light emission area.

Figure 18:
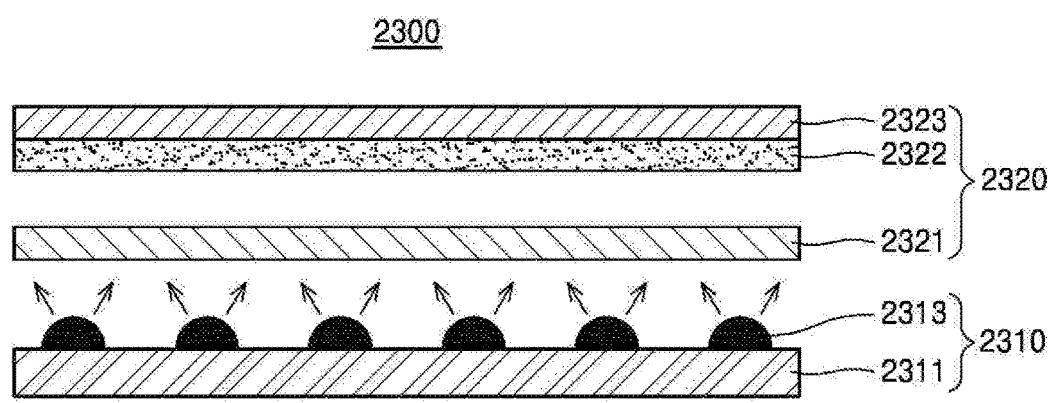
FIG. 18 is a diagram illustrating a direct-type backlight unit including a light-emitting apparatus, according to an exemplary embodiment.
Figure 19:
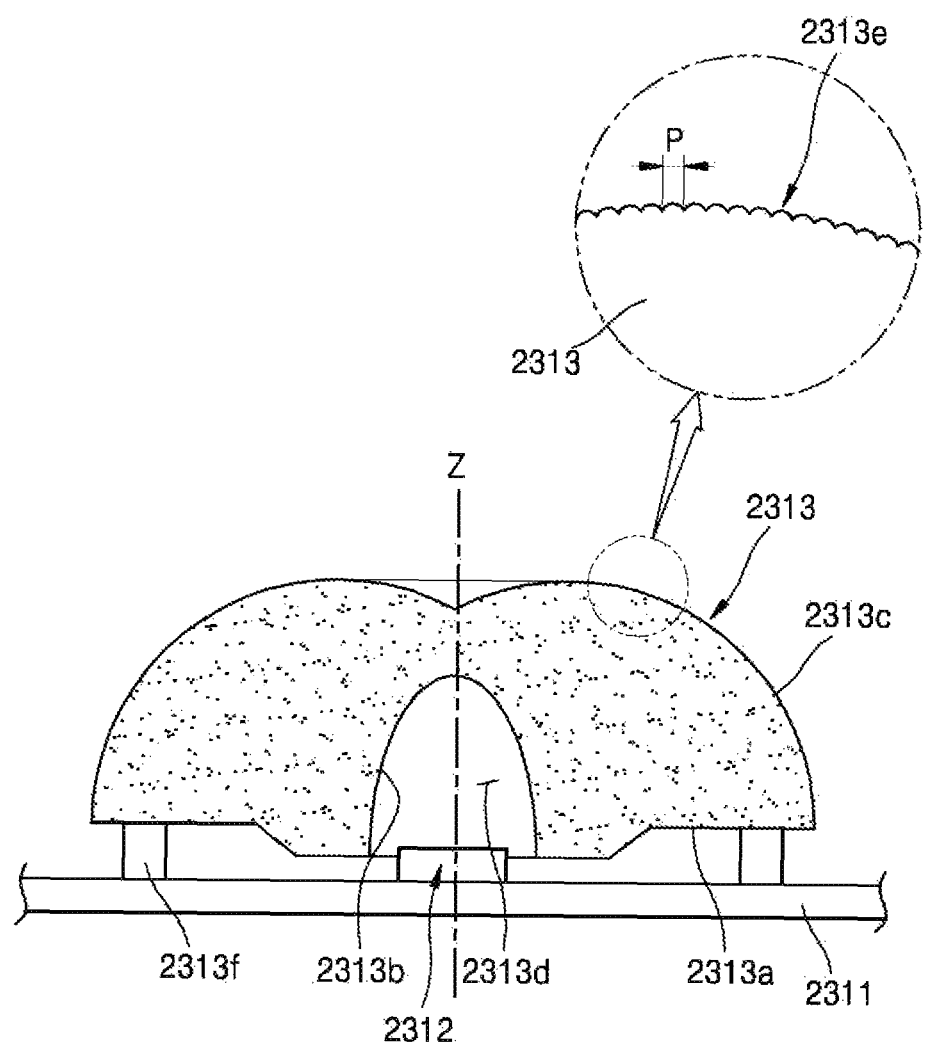
FIG. 19 is an enlarged view of a light source module of FIG. 18.

FIG. 18 is a diagram illustrating a direct-type backlight unit 2300 including a light-emitting apparatus, according to an exemplary embodiment, and FIG. 19 is an enlarged view of a light source module 2310 of FIG. 18.

Referring to FIG. 18, the direct-type backlight unit 2300 according to the present exemplary embodiment may include an optical sheet 2320 and a light source module 2310 under the optical sheet 2320. The optical sheet 2320 may include a diffusion sheet 2321, a light concentration sheet 2322, and a protection sheet 2323.

The light source module 2310 may include a circuit board 2311, a plurality of light sources 2312 mounted on the circuit board 2311, and a plurality of optical elements 2313 respectively on the plurality of light sources 2312. The light source 2312 may be the above-described light-emitting apparatus 100, 100_1, 100_2, or 100_3 according to the exemplary embodiment.

The optical element 2313 may adjust an orientation angle of light through reflection. In particular, a light orientation-angle lens configured to diffuse light of the light source 2312 to a wider region may be used. Since the light source 2312, to which the optical element 2313 is attached, has a wider light distribution, the number of light sources 2312 per the same area may be reduced when the light source module 2310 is used in a backlight or a flat-panel lighting apparatus.

As illustrated in FIG. 19, the optical element 2313 may include a bottom surface 2313*a* a portion of which is on the light source 2312, an incidence surface 2313*b* on which the light of the light source 2312 is incident, and an exit surface 2313*c* through which the light exists. The optical element 2313 may further include a groove 2313*d* recessed in a direction of the exit surface 2313*c* and an optical axis Z of the light source 2312 passes through a center of the groove 2313*d*. The groove 2313*d* may be defined by the incidence surface 2313*b* on which the light of the light source 2312 is incident. That is, the incidence surface 2313*b* may form a surface of the groove 2313*d*.

The bottom surface 2313*a* of the optical element 2313 may partially protrude toward the light source 2312 in a central portion connected to the incidence surface 2313*b* to thereby have a non-planar structure as a whole. That is, unlike a general flat structure, the bottom surface 2313*a* of the optical element 2313 may partially protrude along a periphery of the groove 2313*d*. A plurality of supports 2313*f* may be provided on the bottom surface 2313*a* of the optical element 2313. When the optical element 2313 is mounted on the circuit board 2311, the plurality of supports 2313*f* may fix and support the optical element 2313.

The exit surface 2313*c* of the optical element 2313 may have a dome shape and protrude upward (or a light exit direction) from an edge connected to the bottom surface 2313*a*, and have an inflection point such that a center through which the optical axis Z passes is concavely recessed toward the groove 2313*d*. A plurality of convex portions 2313*e* (or concave portions depending on a view point) may be periodically arranged on the exit surface 2313*c* in a direction of the edge from the optical axis Z. The plurality of convex portions 2313*e*, in a horizontal cross-sectional view, may have a ring shape and may form a concentric circle from the optical axis Z with respect to a horizontal cross-sectional shape of the optical element 2313. The plurality of convex portions 2313*e* may be radially arranged relative to the optical axis Z while forming periodic patterns along the surface of the exit surface 2313*c*.

The plurality of convex portions 2313*e* may be spaced apart by regular pitches P from each other to form patterns. In this case, the pitch P between the plurality of convex portions 2313*e* may be in the range of about 0.01 mm to about 0.04 mm. The plurality of convex portions 2313*e* may offset a difference of performance between the optical elements due to a fine processing error that may occur in the process of manufacturing the optical element 2313, and may improve the uniformity of the light distribution accordingly.

Figure 20:
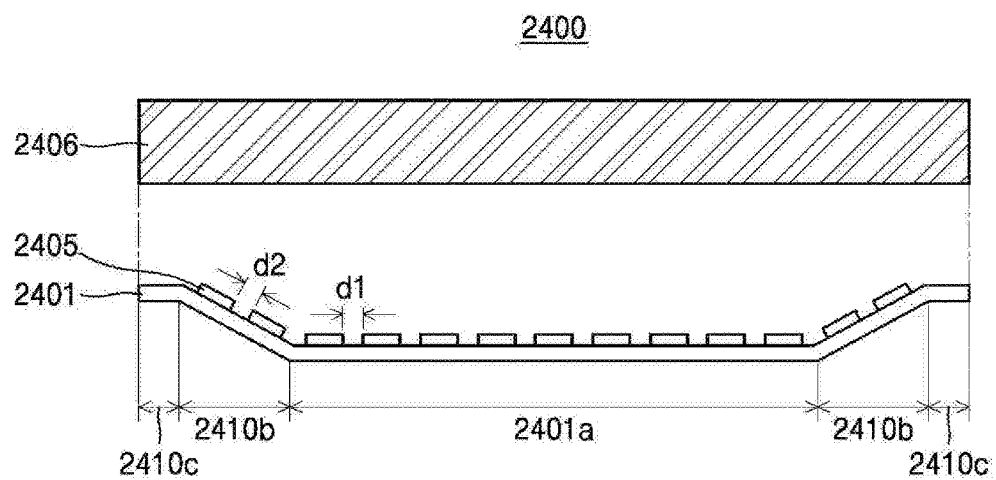
FIG. 20 is a diagram illustrating a direct-type backlight unit including a light-emitting apparatus, according to an exemplary embodiment.

FIG. 20 is a diagram illustrating a direct-type backlight unit 2400 including a light-emitting apparatus, according to an exemplary embodiment.

Referring to FIG. 20, the direct-type backlight unit 2400 may include a circuit board 2401, a light source 2405 mounted on the circuit board 2401, and one or more optical sheets 2406 on the light source 2405. The light source 2405 may be a white light-emitting apparatus including a red phosphor. The light source 2405 may be a module mounted on the circuit board 2401. The light source 2405 may be the above-described light-emitting apparatus 100, 100_1, 100_2, or 100_3 according to the exemplary embodiment.

The circuit board 2401 may has a first flat portion 2401*a* corresponding to a main region, an inclined portion 2401*b* arranged around the first flat portion 2401*a* and bent in at least a portion thereof, and a second flat portion 2401*c* arranged at an edge of the circuit board 2401 that is an outside of the inclined portion 2401*b*. The light sources 2405 may be arranged at a first interval d1 on the first flat portion 2401*a*, and one or more light sources 2405 may also be arranged at a second interval d2 on the inclined portion 2401*b*. The first interval d1 may be substantially equal to the second interval d2. A width (or a length in a cross-section) of the inclined portion 2401*b* may be smaller than a width of the first flat portion 2401*a* and larger than a width of the second flat portion 2401*c*. In addition, at least one light source 2405 may be arranged on the second flat portion 2401*c* depending on an embodiment.

A slope of the inclined portion 2401*b* may be appropriately adjusted in the range of greater than 0 degree and less than 90 degrees with respect to the first flat portion 2401*a*. By using the above configuration, the circuit board 2401 may maintain uniform brightness even at the edge of the optical sheet 2406.

Figure 21:
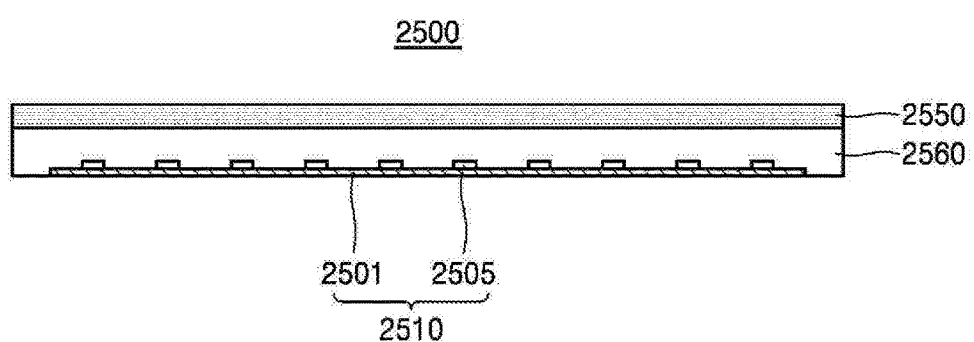
FIGS. 21 to 23 are diagrams illustrating backlight units including light-emitting apparatuses, according to exemplary embodiments.
Figure 22:
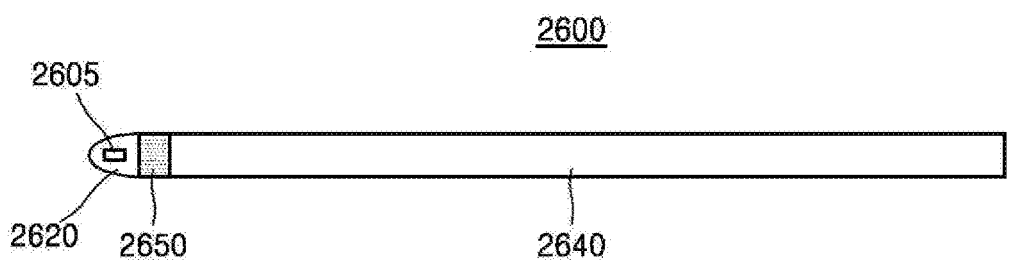
Figure 23:
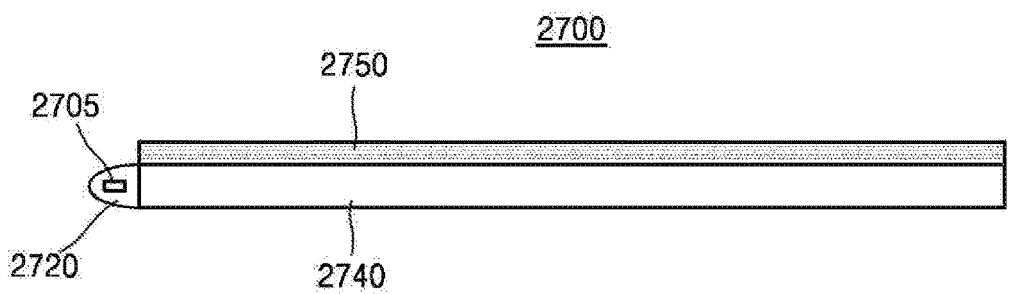

FIGS. 21 to 23 are diagrams illustrating backlight units 2500, 2600, and 2700 including light-emitting apparatuses, according to exemplary embodiments.

In the backlight units 2500, 2600, and 2700, wavelength conversion layers 2550, 2650, and 2750 are not arranged in light sources 2505, 2605, and 2705. The wavelength conversion layers 2550, 2650, and 2750 are arranged in the backlight units 2500, 2600, and 2700 outside the light sources 2505, 2605, and 2705 to convert light. The light sources 2505, 2605, and 2705 may be the above-described light-emitting apparatus 100, 100_1, 100_2, or 100_3 according to the exemplary embodiment.

The backlight unit 2500 of FIG. 21 is a direct-type backlight unit and may include the wavelength conversion layer 2550, a light source module 2510 under the wavelength conversion layer 2550, and a bottom case 2560 accommodating the light source module 2510. In addition, the light source module 2510 may include a PCB 2501 and a plurality of light sources 2505 mounted on the PCB 2501.

In the backlight unit 2500, the wavelength conversion layer 2550 may be on the bottom case 2560. Therefore, at least a part of the light emitted by the light source module 2510 may be wavelength-converted by the wavelength conversion layer 2550. The wavelength conversion layer 2550 may be manufactured as a separate film and may be integrated with a light diffusion plate (not illustrated).

The backlight units 2600 and 2700 of FIGS. 22 and 23 are edge-type backlight units and may respectively include the wavelength conversion layer 2650 and 2750, light guide plates 2640 and 2740, and reflection units 2620 and 2720, and light sources 2605 and 2705 arranged on one side of the light guide plates 2640 and 2740. The light emitted by the light sources 2605 and 2705 may be guided toward the light guide plates 2640 and 2740 by the reflection units 2620 and 2720, respectively. In the backlight unit 2600 of FIG. 22, the wavelength conversion layer 2650 may be arranged between the light guide plate 2640 and the light source 2605. In the backlight unit 2700 of FIG. 23, the wavelength conversion layer 2750 may be on a light emission surface of the light guide plate 2740.

The wavelength conversion layers 2550, 2650, and 2750 may include phosphors. In particular, QD phosphors may be used for complementing characteristics of QDs that are vulnerable to moisture or heat from the light source.

Figure 24:
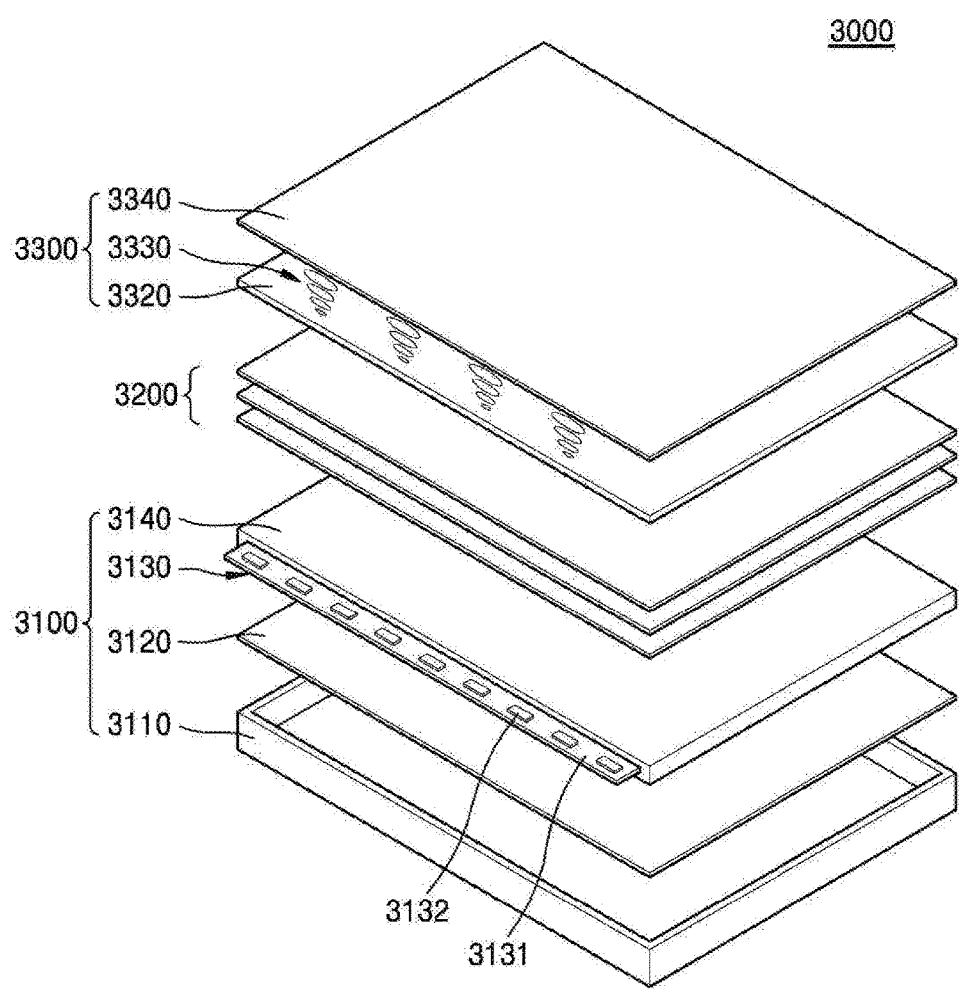
FIG. 24 is a schematic, exploded perspective view of a display apparatus including a light-emitting apparatus, according to an exemplary embodiment.

FIG. 24 is a schematic, exploded perspective view of a display apparatus 3000 including a light-emitting apparatus, according to an exemplary embodiment.

Referring to FIG. 24, the display apparatus 3000 may include a backlight unit 3100, an optical sheet 3200, and a display panel 3300 such as a liquid crystal panel. The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132 mounted on the PCB 3131.

In particular, the light source 3132 may be a side view type light-emitting device mounted on a side adjacent to a light emission surface of the light guide plate 3140. The light source 3132 may be the above-described light-emitting apparatus 100, 100_1, 100_2, or 100_3 according to the exemplary embodiment. The optical sheet 3200 may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in a matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

According to the present exemplary embodiment, since the display apparatus 3000 uses the light source 3132 configured to emit blue light, green light, and red light having a relatively small half-width, the emitted light may implement blue, green, and red colors having a high color purity after passing through the color filter substrate 3340.

Figure 25:
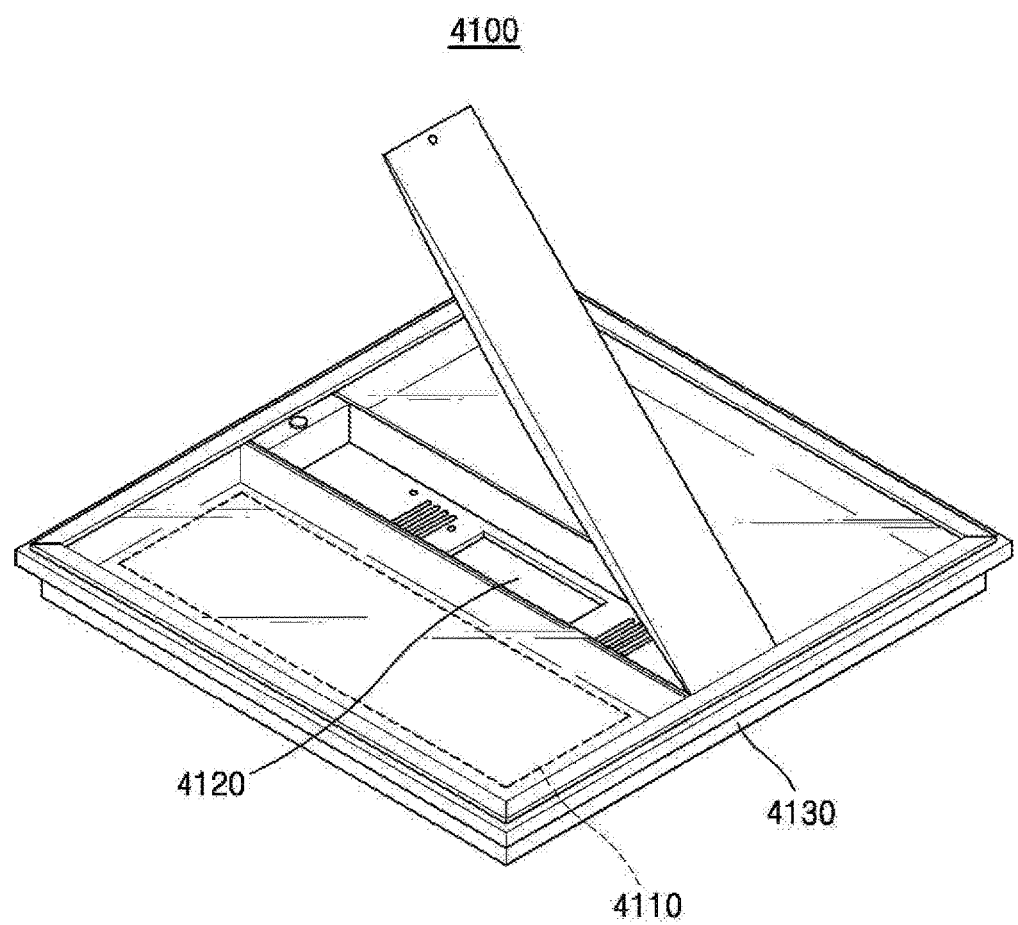
FIG. 25 is a schematic perspective view of a flat-panel lighting apparatus including a light-emitting apparatus, according to an exemplary embodiment.

FIG. 25 is a schematic perspective view of a flat-panel lighting apparatus 4100 including a light-emitting apparatus, according to an exemplary embodiment.

Referring to FIG. 25, the flat-panel lighting apparatus 4100 may include a light source module 4110, a power supply 4120, and a housing 4030. According to the present exemplary embodiment, the light source module 4110 may include a light-emitting device array as a light source. The light source module 4110 may include the above-described light-emitting apparatus 100, 100_1, 100_2, or 100_3 according to the exemplary embodiment as a light source. The power supply 4120 may include a light-emitting device driver.

The light source module 4110 may include a light-emitting device array and may be formed to have a flat shape as a whole. According to the present exemplary embodiment, the light-emitting device array may include a light-emitting device and a controller configured to store driving information regarding the light-emitting device.

The power supply 4120 may be configured to supply power to the light source module 4110. The housing 4130 may form an accommodation space for accommodating the light source module 4110 and the power supply 4120. The housing 4130 is formed to have a hexahedral shape with one opened side, but is not limited thereto. The light source module 4110 may be arranged to emit light toward the opened side of the housing 4130.

Figure 26:
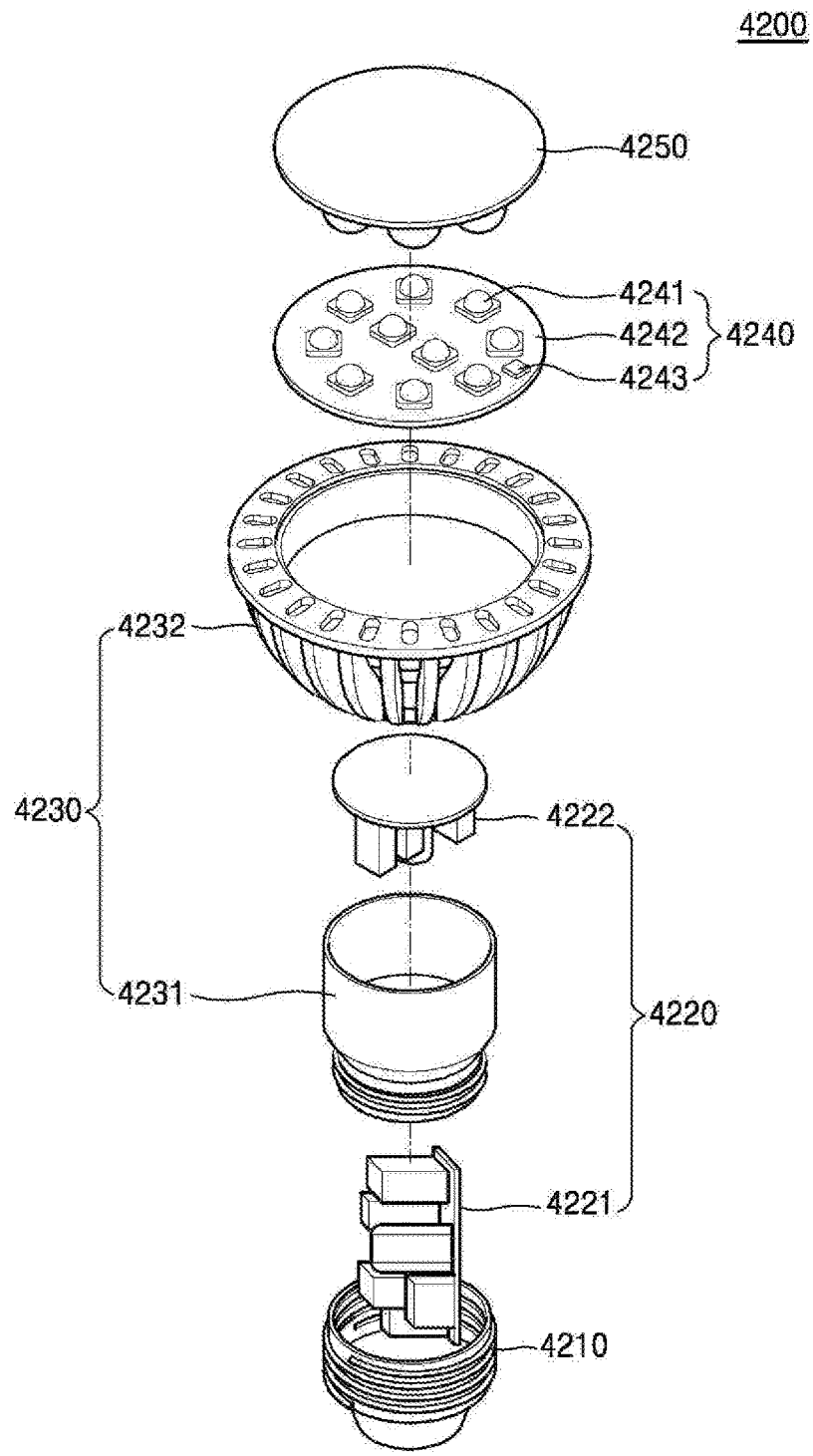
FIG. 26 is a schematic, exploded perspective view of a lighting apparatus including a light-emitting apparatus, according to an exemplary embodiment.

FIG. 26 is a schematic, exploded perspective view of a lighting apparatus 4200 including a light-emitting apparatus, according to an exemplary embodiment.

Referring to FIG. 26, the lighting apparatus 4200 may include a socket 4210, a power supply 4220, a heat sink 4230, a light source module 4240, and an optical unit 4250. According to the present exemplary embodiment, the light source module 4240 may include a light-emitting device array, and the power supply 4220 may include a light-emitting device driver.

The socket 4210 may be configured to be replaceable with an existing lighting apparatus. Power may be supplied to the lighting apparatus 4200 through the socket 4210. The power supply 4220 may be dissembled into a first power supply 4221 and a second power supply 4220. The heat sink 4230 may include an internal heat sink 4231 and an external heat sink 4232. The internal heat sink 4231 may be directly connected to the light source module 4240 and/or the power supply 4220. The internal heat sink 4231 may transfer heat to the external heat sink 4232. The optical unit 4250 may include an internal optical unit (not illustrated) and an external optical unit (not illustrated). The optical unit 4250 may be configured to uniformly disperse light emitted by the light source module 4240.

The light source module 4240 may receive power from the power supply 4220 and emit light to the optical unit 4250. The light source module 4240 may include one or more light-emitting apparatuses 4241, a circuit board 4242, and a controller 4243. The controller 4243 may store driving information regarding the light-emitting apparatuses 4241. The light-emitting apparatuses 4241 may include the above-described light-emitting apparatus 100, 100_1, 100_2, or 100_3 according to the exemplary embodiment.

Figure 27:
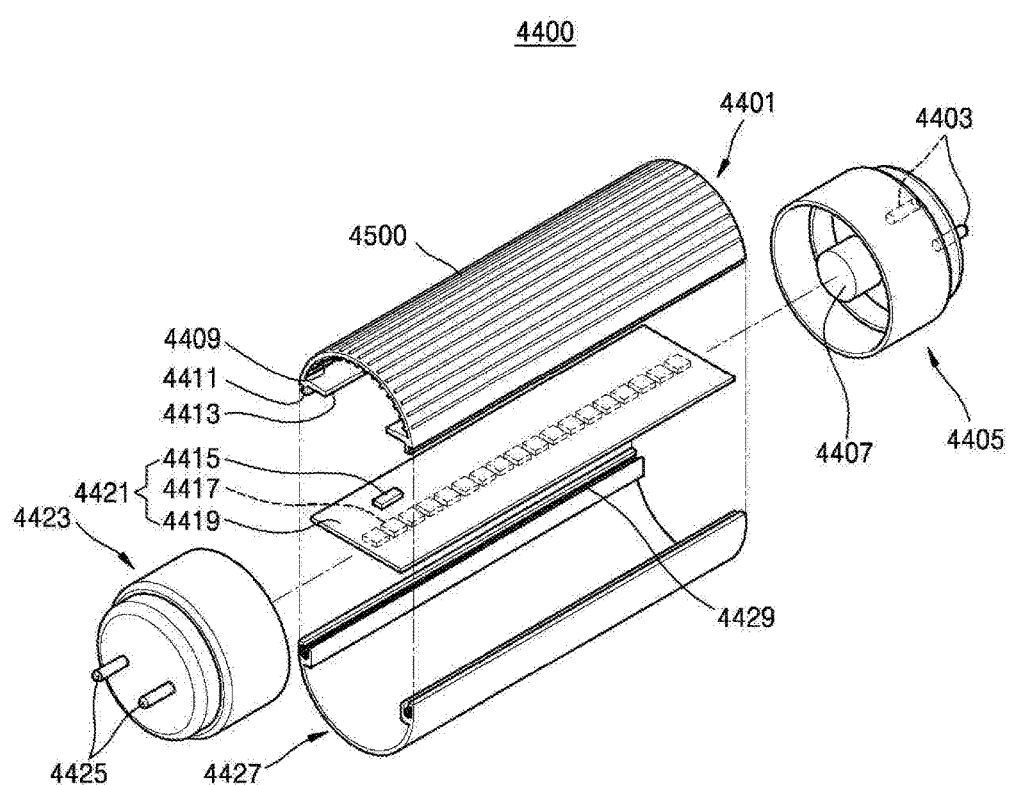
FIG. 27 is a schematic, exploded perspective view of a bar-type lighting apparatus including a light-emitting apparatus, according to an exemplary embodiment.

FIG. 27 is a schematic, exploded perspective view of a bar-type lighting apparatus 4400 including a light-emitting apparatus, according to an exemplary embodiment.

Referring to FIG. 27, the bar-type lighting apparatus 4400 may include a heat sink member 4401, a cover 4427, a light source module 4421, a first socket 4405, and a second socket 4423. A plurality of heat sink fins 4500 and 4409 having a concave or convex shape may be formed on inner and/or outer surfaces of the heat sink member 4401. The heat sink fins 4500 and 4409 may be designed to have various shapes and intervals. A support 4413 having a protruding shape may be formed inside the heat sink member 4401. The light source module 4421 may be fixed to the support 4413. Locking protrusions 4411 may be formed on both ends of the heat sink member 4401.

Locking grooves 4429 may be formed in the cover 4427. The locking protrusions 4411 of the heat sink member 4401 may be hooked to the locking grooves 4429. The positions of the locking grooves 4429 may be exchanged with the positions of the locking protrusions 4411.

The light source module 4421 may include a light-emitting device array. The light source module 4421 may include a PCB 4419, a light source 4417, and a controller 4415. The controller 4415 may store driving information of the light source 4417. Circuit wirings may be formed on the PCB 4419 to operate the light source 4417. In addition, the light source module 4421 may include components for operating the light source 4417. The light source 4417 may include the above-described light-emitting apparatus 100, 100_1, 100_2, or 100_3 according to the exemplary embodiment.

The first and second sockets 4405 and 4423 may be provided as a pair of sockets and may be connected to both ends of a cylindrical cover unit including the heat sink member 4401 and the cover 4427. For example, the first socket 4405 may include an electrode terminal 4403 and a power supply 4407, and the second socket 4423 may include a dummy terminal 4425. In addition, an optical sensor module and/or a communication module may be embedded into the first socket 4405 or the second socket 4423. For example, the optical sensor module and/or the communication module may be embedded into the second socket 4423 in which the dummy terminal 4425 is arranged. As another example, the optical sensor module and/or the communication module may be embedded into the first socket 4405 in which the electrode terminal 4403 is arranged.

Figure 28:
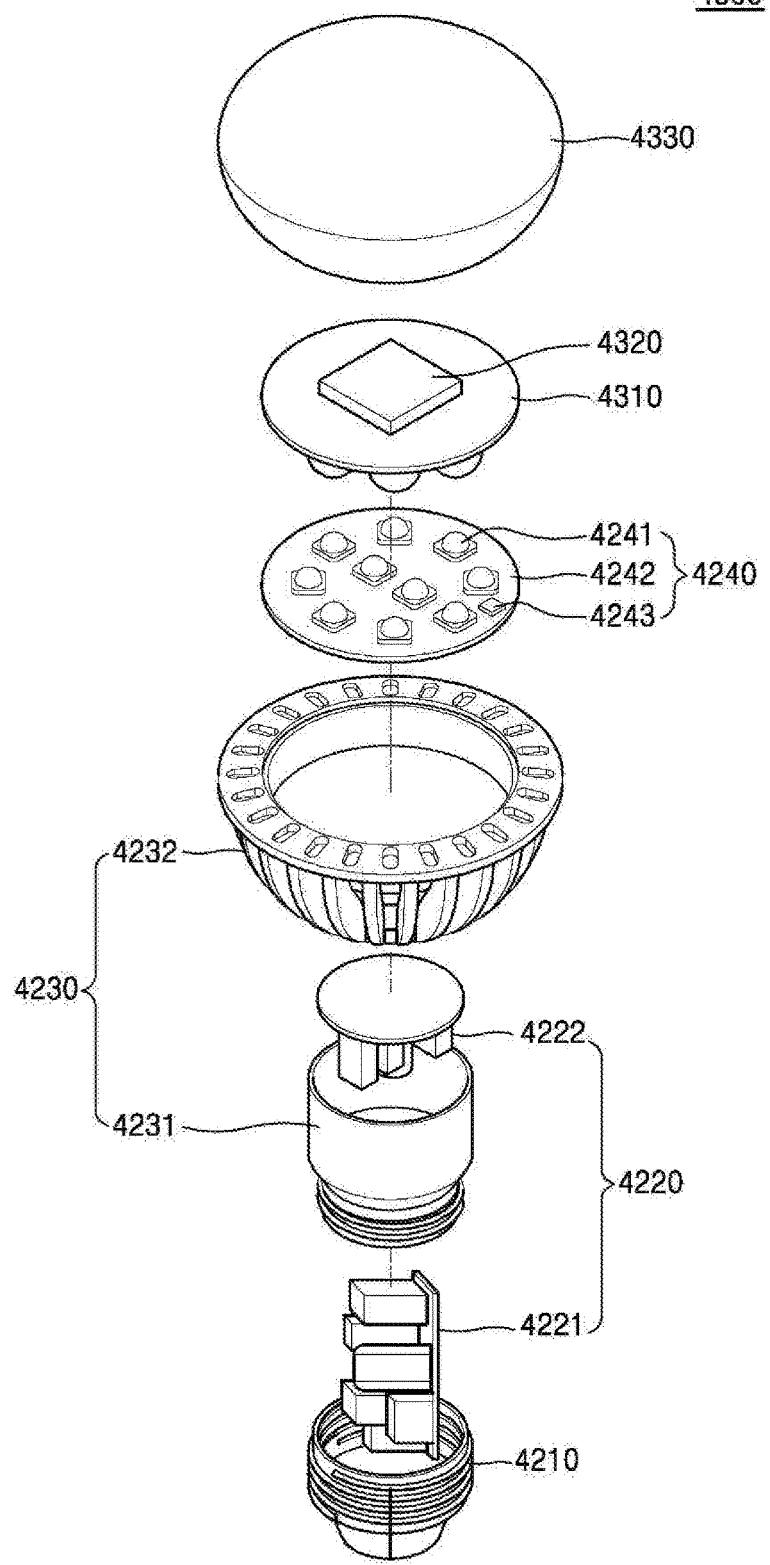
FIG. 28 is a schematic, exploded perspective view of a lighting apparatus including a light-emitting apparatus, according to an exemplary embodiment.

FIG. 28 is a schematic, exploded perspective view of a lighting apparatus 4500 including a light-emitting apparatus, according to an exemplary embodiment.

The lighting apparatus 4500 of FIG. 28 differs from the lighting apparatus 4200 of FIG. 26 in that a reflection plate 4310 and a communication module 4320 are provided on a light source module 4240. The descriptions of the same components as shown in FIG. 26 will be omitted.

The reflection plate 4310 may uniformly disperse light from the light source in a lateral direction and a rearward direction to reduce glare.

The communication module 4320 may be mounted on the reflection plate 4310, and a home network communication may be performed through the communication module 4320. For example, the communication module 4320 may be a wireless communication module using ZigBee, WiFi, or LiFi, and control an indoor or outdoor lighting apparatus, such as on/off operations or brightness adjustment of the lighting apparatus through a smartphone or a wireless controller. In addition, electronic appliances and vehicle systems, such as TVs, refrigerators, air conditioners, doorlock systems, vehicles, may be controlled through a light fidelity (LiFi) communication module using a wavelength of visible light in the indoor or outdoor lighting apparatus. The reflection plate 4310 and the communication module 4320 may be covered by the cover 4330.

Figure 29:
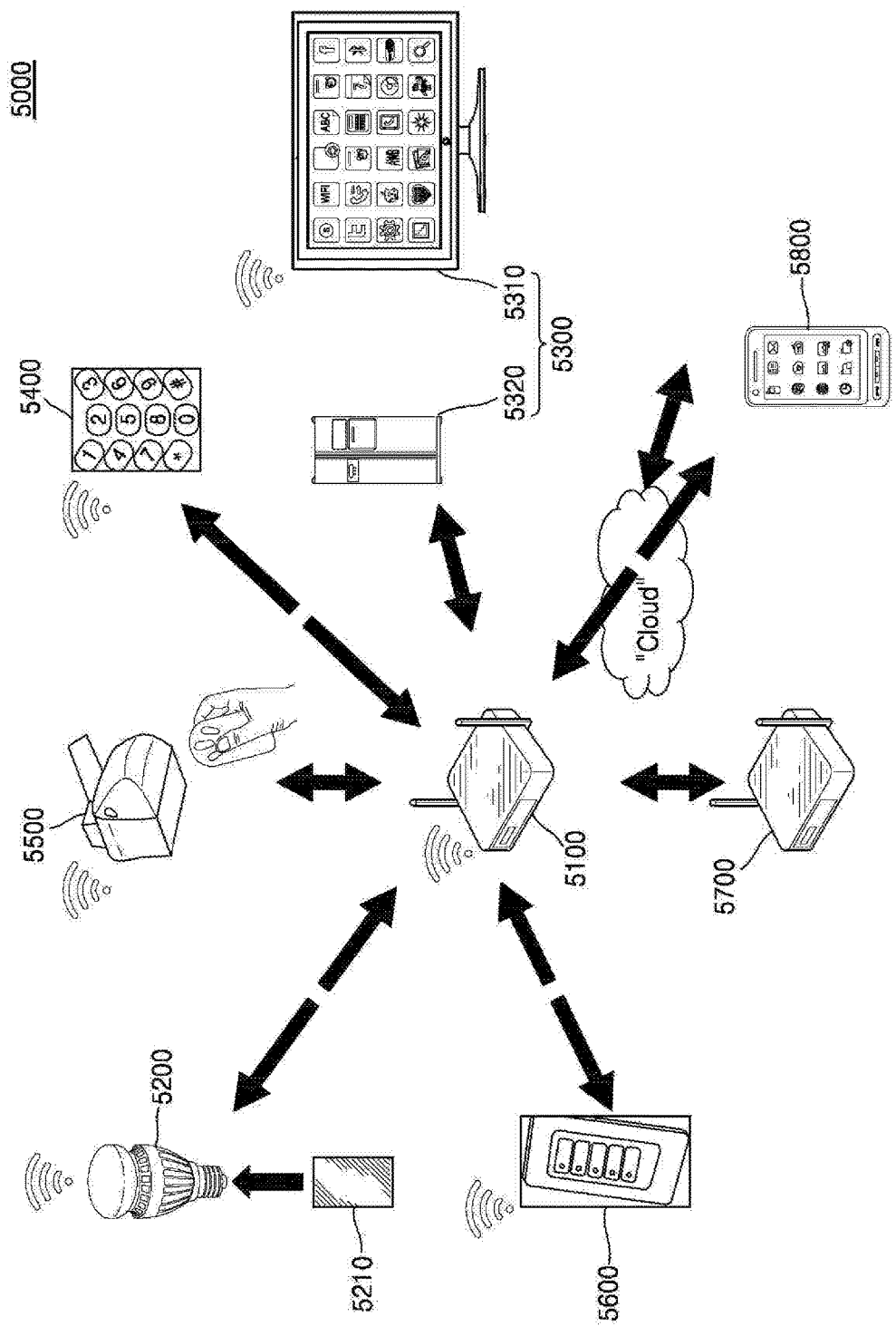
FIG. 29 is a schematic diagram illustrating an indoor lighting control network system including a light-emitting apparatus, according to an exemplary embodiment.

FIG. 29 is a schematic diagram illustrating an indoor lighting control network system 5000 including a light-emitting apparatus, according to an exemplary embodiment.

Referring to FIG. 29, the indoor lighting control network system 5000 may be a composite smart lighting-network system in which a illumination technology using an LED, an Internet of Things (IoT) technology, a wireless communication technology converge. The network system 5000 may be implemented using various lighting apparatuses and wired/wireless communication devices, and may be implemented by a sensor, a controller, a communication device, and software for network control and maintenance.

The network system 5000 may be applied to a closed space defined in buildings such as offices, an open space such as parks or streets, and the like. The network system 5000 may be implemented based on an IoT environment to collect, process, and provide a variety of information to users.

An LED lamp 5200 included in the network system 5000 may receive information about an ambient environment from a gateway 5100 and control illumination of the LED lamp 5200. Furthermore, the LED lamp 5200 may check and control the operation states of other devices 5300 to 5800 included in the IoT environment based on a visible light communication function of the LED lamp 5200. The LED lamp 5200 may include the above-described light-emitting apparatus 100, 100_1, 100_2, or 100_3 according to the exemplary embodiment.

The network system 5000 may include the gateway 5100 configured to process data transmitted and received in accordance with different communication protocols, the LED lamp 5200 communicably connected to the gateway 5100 and including an LED, and a plurality of devices 5300 to 5800 communicably connected to the gateway 5100 in accordance with various wireless communication schemes. To implement the network system 5000 based on the IoT environment, the devices 5300 to 5800, including the LED lamp 5200, may include at least one communication module. According to the present exemplary embodiment, the LED lamp 5200 may be communicably connected to the gateway 5100 by the wireless communication protocol such as WiFi, ZigBee, or LiFi. To this end, the LED lamp 5200 may include at least one lamp communication module 5210.

The network system 5000 may be applied to a closed space such as homes or offices, an open space such as parks or streets, and the like. In a case where the network system 5000 is applied to the home, the plurality of devices 5300 to 5800, which are included in the network system 5000 and communicably connected to the gateway 5100 based on the IoT technology, may include electronic appliances 5300 such as a refrigerator 5320 and a TV 5310, a digital doorlock 5400, a garage doorlock 5500, a lighting switch 5600 installed on a wall, a router 5700 for relaying a wireless communication network, and mobile devices 5800 such as smartphones, tablets, or laptop computers.

In the network system 5000, the LED lamp 5200 may check the operation states of the various devices 5300 to 5800 or automatically control the illumination of the LED lamp 5200 according to the ambient environment and conditions by using the wireless communication network (e.g., ZigBee, WiFi, LiFi, etc.) installed at home. In addition, the LED lamp 5200 may control the devices 5300 to 5800 included in the network system 5000 through the LiFi communication using the visible light emitted by the LED lamp 5200.

The LED lamp 5200 may automatically control the illumination of the LED lamp 5200 based on the information about the ambient environment, which is transmitted from the gateway 5100 through the lamp communication module 5210, or the information about the ambient environment, which is collected from the sensor mounted on the LED lamp 5200. For example, the brightness of the LED lamp 5200 may be automatically adjusted according to a kind of a TV program aired on the TV 5310 or a screen brightness of the TV 5310. To this end, the LED lamp 5200 may receive operation information of the TV 5310 from the lamp communication module 5210 connected to the gateway 5100. The lamp communication module 5210 may be integrally modularized with the sensor and/or the controller included in the LED lamp 5200.

For example, when the kind of a program broadcast on the TV 5310 is drama, the LED lamp 5200 may lower a color temperature to 12,000 K or less (e.g., 5,000 K) and adjust a color sense according to a preset value, to create a cozy atmosphere. On the other hand, when the kind of a program broadcast on the TV 5310 is comedy, the LED lamp 5200 may increase a color temperature to 5,000 K or more according to a set value, to provide bluish white light.

In addition, after an elapse of a predetermined time after the digital doorlock 5400 has been locked in a state that no person is present at home, it is possible to prevent waste of electricity by turning off the turned-on LED lamp 5200. Alternatively, in a case where a security mode is set through the mobile device 5800 or the like, when the digital doorlock 5400 is locked in a state that no person is present at home, the LED lamp 5200 may maintain the turned-on state.

The operation of the LED lamp 5200 may be controlled according to information about the ambient environment, which is collected through various sensors connected to the network system 5000. For example, in a case where the network system 5000 is implemented in a building, it is possible to turn on or off the illumination by combining a lighting apparatus, a position sensor, and a communication module within the building, or provide collected information in real time, thus enabling efficient facility management or efficient utilization of unused space. Since the lighting apparatus such as the LED lamp 5200 is usually arranged in almost all spaces of each floor in the building, a variety of information about the building may be collected through a sensor integrally provided with the LED lamp 5200, and the collected information may be used for facility management and utilization of unused spaces.

On the other hand, by combining the LED lamp 5200 with an image sensor, a storage device, the lamp communication module 5210, or the like, the LED lamp 5200 may be used as a device capable of maintaining building security or sensing and handling emergency situations. For example, when a smoke or temperature sensor is attached to the LED lamp 5200, it is possible to promptly detect an outbreak of fire, thus minimizing fire damage. In addition, it is possible to adjust the brightness of the lighting apparatus, save energy, and provide a pleasant illumination environment, by taking into consideration outside weather or amount of sunshine.

As described above, the network system 5000 may be applied to a closed space such as homes, offices, or buildings, an open space such as parks or streets, and the like. In a case where the network system 5000 is intended to apply to an open space without physical limitations, it may be relatively difficult to implement the network system 5000 due to a distance limitation of wireless communication and a communication interference caused by various obstacles. By mounting the sensors and the communication modules on various lighting apparatuses and using the lighting apparatuses as information collection units and communication relay units, the network system 5000 may be more efficiently implemented in the open environments.

Figure 30:
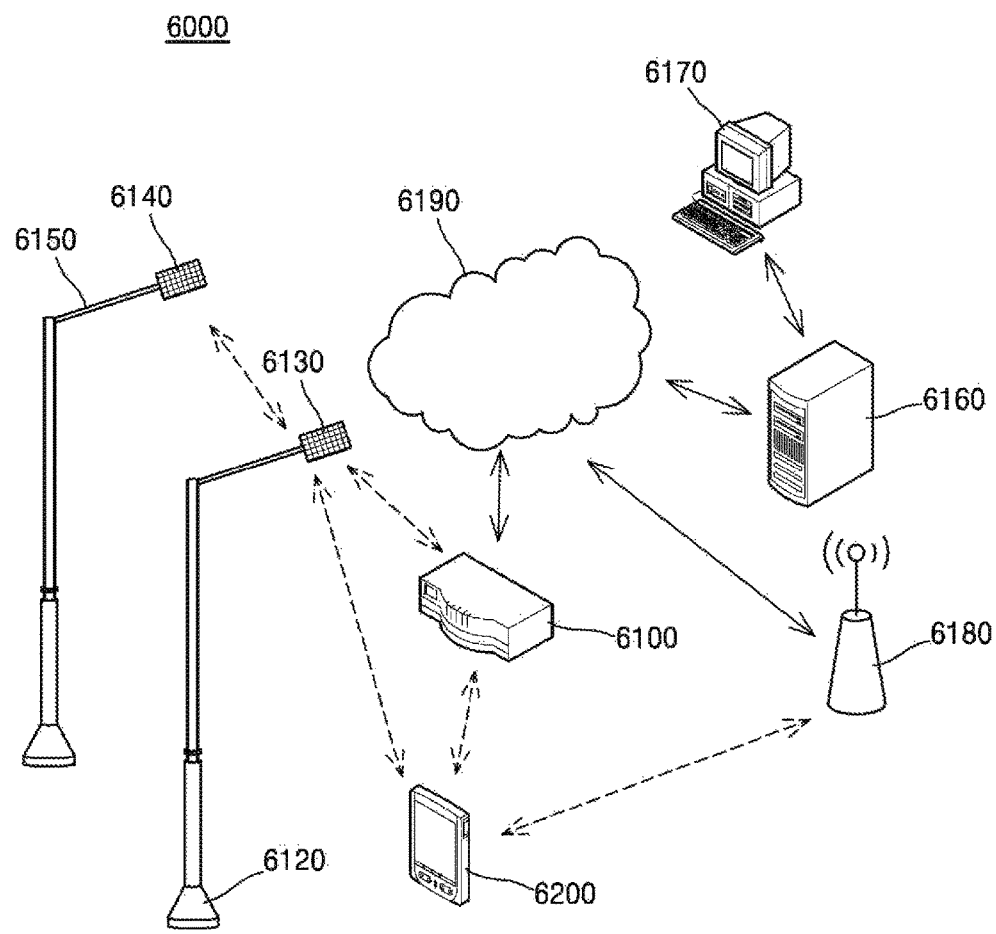
FIG. 30 is a schematic diagram illustrating a network system including a light-emitting apparatus, according to an exemplary embodiment.

FIG. 30 is a schematic diagram illustrating a network system 6000 including a light-emitting apparatus, according to an exemplary embodiment.

Specifically, FIG. 30 illustrates the network system 6000 applied to an open space. The network system 6000 may include a communication connecting device 6100, a plurality of lighting apparatuses 6120 and 6150 installed, for example, at predetermined intervals and communicably connected to the communication connecting device 6100, a server 6160, a computer 6170 configured to manage the server 6160, a communication base station 6180, a communication network 6190 configured to connect communicable devices, and a mobile device 6200.

The plurality of lighting apparatuses 6120 and 6150 installed in open external spaces such as streets or parts may include smart engines 6130 and 6140, respectively. Each of the smart engines 6130 and 6140 may include a light-emitting device configured to emit light, a driver configured to drive the light-emitting device, a sensor configured to collect information about an ambient environment, and a communication module. The light-emitting devices included in the smart engines 6130 and 6140 may include the above-described light-emitting apparatus 100, 100_1, 100_2, or 100_3 according to the exemplary embodiment.

The communication module may enable the smart engines 6130 and 6140 to communicate with other peripheral devices in accordance with the communication protocol such as WiFi, ZigBee, or LiFi.

For example, the smart engine 6130 of the lighting apparatus 6120 may be communicably connected to the smart engine 6140 of the lighting apparatus 6150. In this case, a WiFi mesh may be applied to the communication between the smart engines 6130 and 6140. At least one smart engine 6130 may be connected to the communication connecting device 6100 connected to the communication network 6190 by a wired and/or wireless communication. To increase the efficiency of communication, the plurality of smart engines 6130 and 6140 may be grouped into one group and be connected to one communication connecting device 6100.

The communication connecting device 6100 may be an access point (AP) capable of performing wired and/or wireless communications and may relay a communication between the communication network 6190 and other devices. The communication connecting device 6100 may be connected to the communication network 6190 by at least one of the wired and/or wireless communication schemes. For example, the communication connecting device 6100 may be mechanically accommodated in one of the lighting apparatuses 6120 and 6150.

The communication connecting device 6100 may be connected to the mobile device 6200 through the communication protocol such as WiFi. A user of the mobile device 6200 may receive information about the ambient environment, which is collected by the plurality of smart engines 6130 and 6140, through the communication connecting device connected to the smart engine 6130 of the lighting apparatus 6120. The information about the ambient environment may include neighboring traffic information, weather information, and the like. The mobile device 6200 may be connected to the communication network 6190 through the communication base station 6180 by a wireless cellular communication scheme such as a 3G or 4G communication scheme.

On the other hand, the server 6160 connected to the communication network 6190 may receive information collected by the smart engines 6130 and 6140 respectively mounted on the lighting apparatuses 6120 and 6150 and may monitor the operation states of the lighting apparatuses 6120 and 6150. To manage the lighting apparatuses 6120 and 6150 based on the monitoring result of the operation states of the lighting apparatuses 6120 and 6150, the server 6160 may be connected to the computer 6170 that provides the management system. The computer 6170 may execute software capable of monitoring and managing the operation states of the lighting apparatuses 6120 and 6150, especially the smart engines 6130 and 6140.

Figure 31:
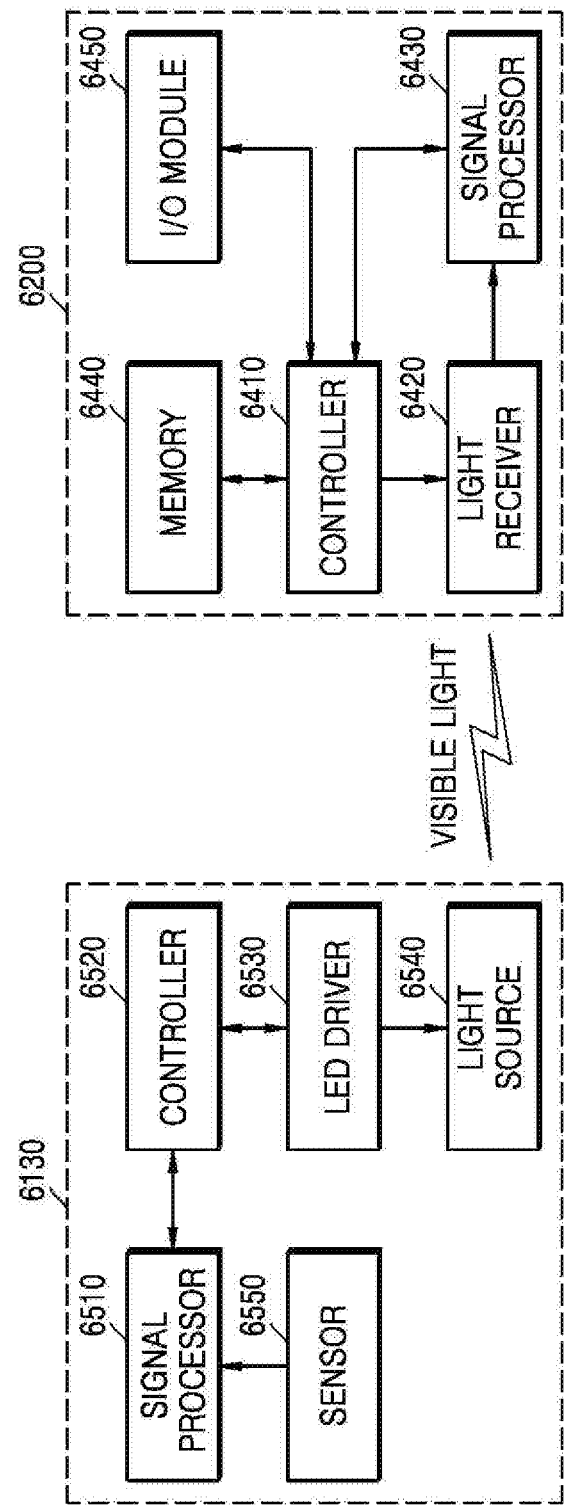
FIG. 31 is a block diagram illustrating a communication operation between a smart engine of a lighting apparatus including a light-emitting apparatus and a mobile device, according to an exemplary embodiment.

FIG. 31 is a block diagram illustrating a communication operation between a smart engine 6130 of a lighting apparatus 6120 and a mobile device 6200, according to an exemplary embodiment.

Specifically, FIG. 31 is a block diagram illustrating a communication operation between the smart engine 6130 of the lighting apparatus 6120 of FIG. 30 and the mobile device 6200 via the visible light wireless communication. Various communication schemes may be applied for transmitting information collected by the smart engine 6130 to the mobile device 6200 of the user.

Through the communication connecting device (6100 of FIG. 30) connected to the smart engine 6130, the information collected by the smart engine 6130 may be transmitted to the mobile device 6200, or the smart engine 6130 and the mobile device 6200 may be directly communicable connected to each other. The smart engine 6130 and the mobile device 6200 may directly communicate with each other through the visible light wireless communication (LiFi).

The smart engine 6130 may include a signal processor 6510, a controller 6520, an LED driver 6530, a light source 6540, and a sensor 6550. The mobile device 6200, which is connected to the smart engine 6130 through the visible light wireless communication, may include a controller 6410, a light receiver 6420, a signal processor 6430, a memory 6440, and an input/output module 6450.

The visible light wireless communication (LiFi) technology is a wireless communication technology that wirelessly transmits information by using light of a visible light wavelength that may be recognized by human eyes. The visible light wireless communication technology differs from the existing wired optical communication technology and infrared wireless communication in that the light of the visible light wavelength, that is, a specific frequency of visible light from the light-emitting apparatus, is used, and differs from the wired optical communication technology in that communication environment is a wireless environment. Compared to the RF wireless communication technology, the visible light wireless communication technology may freely be used without regulation or permission in terms of frequency use. In addition, the visible light wireless communication technology has excellent physical security and has differentiation that enables a user to confirm a communication link with the user's eyes. Furthermore, the visible light wireless communication technology is a convergence technology that is capable of simultaneously obtaining the unique purpose of the light source and the communication function.

The signal processor 6510 of the smart engine 6130 may process data to be transmitted and received through the visible light wireless communication. For example the signal processor 6510 may process information collected by the sensor 6550 into data and transmit the data to the controller 6520. The controller 6520 may control the operations of the signal processor 6510 and the LED driver 6530. In particular, the controller 6520 may control the operation of the LED driver 6530 based on the data transmitted by the signal processor 6510. The LED driver 6530 may transmit the data to the mobile device 6200 by turning on the light source 6540 according to a control signal transmitted by the controller 6520.

The mobile device 6200 may include the light receiver 6420 configured to recognize visible light including data, as well as the controller 6410, the memory 6440 configured to store data, the input/output module 6450 including a display, a touch screen, and an audio output unit, and the signal processor 6430. The light receiver 6420 may detect visible light and convert the detected visible light into an electrical signal. The signal processor 6430 may decode data included in the electrical signal. The controller 6410 may store the decoded data output from the signal processor 6430 in the memory 6440, or may output the decoded data through the input/output module 6450 to allow the user to recognize the decoded data.

Figure 32:
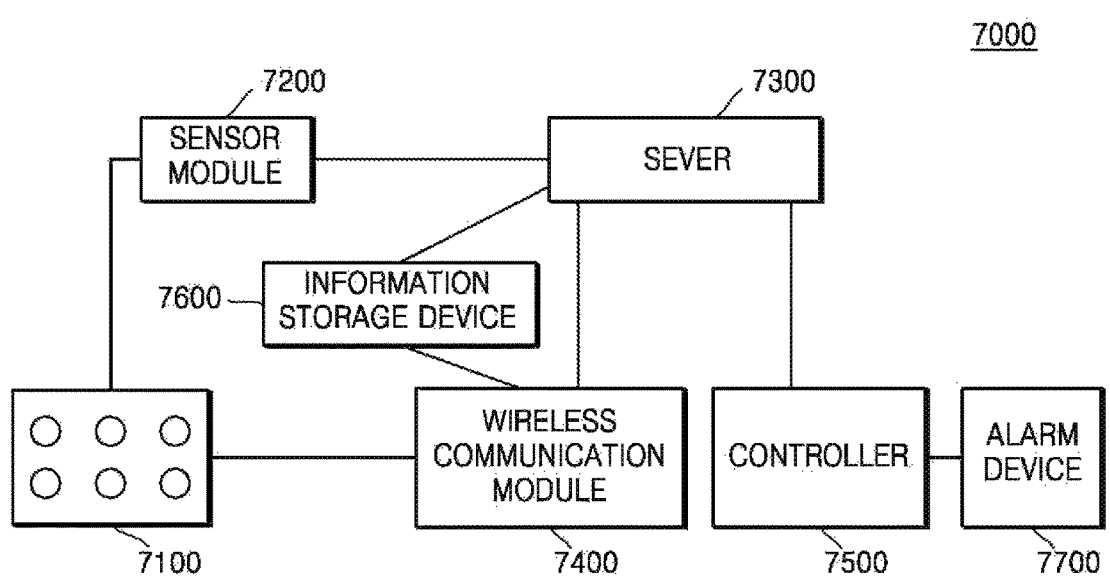
FIG. 32 is a concept diagram of a smart lighting system including a light-emitting apparatus, according to an exemplary embodiment.

FIG. 32 is a concept diagram of a smart lighting system 7000 including a light-emitting apparatus, according to an exemplary embodiment.

Referring to FIG. 32, the smart lighting system 7000 may include an illumination module 7100, a sensor module 7200, a server 7300, a wireless communication module 7400, a controller 7500, and an information storage device 7600. The illumination module 7100 may include one or more lighting apparatuses installed in a building and there is no limitation to a type of the lighting apparatus. Examples of the lighting apparatus may include basic illuminations for a living room, a room, a balcony, a bathroom, stairs, and a front door, a mood illumination, a stand illumination, and a decorative illumination. The lighting apparatus may include the above-described light-emitting apparatus 100, 100_1, 100_2, or 100_3 according to the exemplary embodiment.

The sensor module 7200 may detect illumination states related to the turn-on/off of each lighting apparatus and the intensity of the illumination, output a signal corresponding to the detected illumination state, and transmit the signal to the server 7300. The sensor module 7200 may be provided in the building where the lighting apparatus is installed. One or more sensors module 7200 may be at a position where the illumination states of all of the lighting apparatuses controlled by the smart lighting system 7000 are detectable, or may be provided at each of the lighting apparatuses.

The information about the illumination state may be transmitted to the server 7300 in real time, or may be transmitted with a time difference based on a predetermined time unit such as a minute unit or an hour unit. The server 7300 may be installed inside and/or outside the building. The server 7300 may receive a signal from the sensor module 7200, collect information about the illumination state, such as the turn-on/off of the illumination module 7100 within the building, group the collected information, define an illumination pattern based on the grouped information, and provide information about the defined illumination pattern to the wireless communication module 7400. In addition, the server 7300 may serve as a medium that transmits a command received from the wireless communication module 7400 to the controller 7500.

Specifically, the server 7300 may receive the information about the illumination state of the building, which is detected and transmitted by the sensor module 7200, and collect and analyze the information about the illumination state. For example, the server 7300 may divide the collected information into various groups by a period, such as a time, a day, a day of the week, weekdays and weekends, a preset specified day, a week, and a month. Then, the server 7300 may program a "defined illumination pattern" defined as an illumination pattern of an average day unit, week unit, weekday unit, weekend unit, and month unit based on the grouped information. The "defined illumination pattern" may be periodically provided to the wireless communication module 7400, or may be received from the server 7300 when the user requests the information about the illumination pattern.

In addition, apart from defining of the illumination pattern based on the information about the illumination state received from the sensor module 7200, the server 7300 may provide the wireless communication module 7400 with a "normal illumination pattern" programmed in advance by reflecting a normal illumination state at home. As in the case of the "defined illumination pattern", the "normal illumination pattern" may be periodically provided from the server 7300, or may be provided when there is a request from a user. Only one server 7300 is illustrated in FIG. 32, but two or more servers may be provided depending on an embodiment. Optionally, the "normal illumination pattern" and/or the "defined illumination pattern" may be stored in the information storage device 7600. The information storage device 7600 may be a so-called cloud that is accessible via a network.

The wireless communication module 7400 may select one of the plurality of illumination patterns received from the server 7300 and/or the information storage device 7600 and transmit a command signal for executing or stopping an "automatic illumination mode" to the server 7300. The wireless communication module 7400 may be applied to various portable wireless communication devices such as smartphones, tablet personal computers (PCs), personal digital assistants (PDAs), notebook computers, or netbook computers, which may be carried by the user of the smart lighting system.

Specifically, the wireless communication module 7400 may receive various defined illumination patterns from the server 7300 and/or the information storage device 7600, select desired patterns from the received illumination patterns, and transmit a command signal to the server 7300 to execute the "automatic illumination mode" to operate the illumination module 7100 in the selected illumination pattern. The command signal may be transmitted at a set execution time. Alternatively, in a case where the command signal is transmitted without defining a stop time, the execution of the "automatic illumination mode" may be stopped in response to receiving a stop signal.

In addition, the wireless communication module 7400 may further have a function of allowing the user to partially modify the illumination pattern received from the server 7300 and/or the information storage device 7600 or manipulate a new illumination pattern depending on an embodiment. The modified or newly manipulated "user setting illumination pattern" may be stored in the wireless communication module 7400, may be automatically transmitted to the server 7300 and/or the information storage device 7600, or may be transmitted according to a request. In addition, the wireless communication module 7400 may automatically receive the "defined illumination pattern" and the "normal illumination pattern" from the server 7300 and/or the information storage device 7600, or may receive the "defined illumination pattern" and the "normal illumination pattern" by transmitting a request signal to the server 7300.

The wireless communication module 7400 may exchange a command, a signal, or information with the server 7300 and/or the information storage device 7600, and the server 7300 may serve as a medium between the wireless communication module 7400, the sensor module 7200, and the controller 7500. In this manner, the smart lighting system 7000 may be operated.

The connection between the wireless communication module 7400 and the server 7300 may be performed using an application program of the smartphone. That is, the user may instruct the server 7300 to execute the "automatic illumination mode" through an application program downloaded in the smartphone, or may provide information about the "user setting illumination pattern" manipulated or modified by the user.

The information about the "user setting illumination pattern" may be automatically provided to the server 7300 and/or the information storage device 7600, or may be provided by performing a transmission operation according to a request. This may be determined as a default of the application program, or may be selected by the user according to an option.

The controller 7500 may receive the command signal of executing or stopping the "automatic illumination mode" from the server 7300, and control one or more lighting apparatuses by executing the received command signal in the illumination module 7100. That is, the controller 7500 may control the turn-on/off or the like of the lighting apparatuses included in the illumination module 7100 according to the command signal from the server 7300.

In addition, the smart lighting system 7000 may further include an alarm device 7700 in the building. The alarm device 7700 may give an alarm when there is an intruder in the building.

Specifically, in a case where the "automatic illumination mode" is executed in the building in the absence of the user, when there occurs an abnormal situation deviating from the set illumination pattern due to, for example, an intrusion in the building, the sensor module 7200 may detect the abnormal situation and transmit an alarm signal to the server 7300. The server 7300 may notify the wireless communication module 7400 of the abnormal situation and operate the alarm device 7700 in the building by transmitting a signal to the controller 7500.

In addition, when the alarm signal is transmitted to the server 7300, the server 7300 may directly notify a security company of an emergency situation via the wireless communication module 7400 or a transmission control protocol/Internet protocol (TCP/IP) network.

Although a few embodiments have been shown and described, it would be appreciated by those skilled in the art that changes may be made in the exemplary embodiments without departing from the principles and spirit of the disclosure, the scope of which is defined in the claims and their equivalents.

What is claimed is:

1. A light-emitting apparatus comprising:
   a reflective layer comprising a cavity that penetrates the reflective layer from a top surface to a bottom surface of the reflective layer;
   a light-emitting device disposed in the cavity, the light-emitting device comprising a light-emitting stack and an electrode connected to the light-emitting stack at a bottom surface of the light-emitting stack; and
   a wavelength conversion layer that covers at least one of a top surface and a side surface of the light-emitting device, wherein the light-emitting stack comprises a first conductive-type semiconductor layer, an active layer, and a second conductive-type semiconductor layer, wherein the electrode comprises a first electrode and a second electrode, wherein the first electrode penetrates the second conductive-type semiconductor layer and the active layer to be provided as a conductive via connected to the first conductive-type semiconductor layer, and the second electrode is connected to the second conductive-type semiconductor layer, and Wherein the reflective layer further comprises a bottom portion connected to an end portion of a sloped portion of the reflective layer, the bottom portion extending in a direction parallel to the bottom surface of the reflective layer.

2. The light-emitting apparatus of claim 1, wherein the sloped portion of the reflective layer is provided at an inner side surface of the reflective layer, which contacts the wavelength conversion layer.

3. The light-emitting apparatus of claim 1, wherein the reflective layer comprises a white silicone sheet.

4. The light-emitting apparatus of claim 1, further comprising a reflective film on an inner side surface of the reflective layer.

5. The light-emitting apparatus of claim 1, wherein the wavelength conversion layer comprises an adhesive layer and a phosphor film disposed on the adhesive layer, wherein a bottom surface of the adhesive layer is at a level identical to that of the bottom surface of the reflective layer, and a top surface of the adhesive layer is at a level identical to or higher than that of the top surface of the light-emitting device.

6. The light-emitting apparatus of claim 1, further comprising a lens layer on the reflective layer.

7. The light-emitting apparatus of claim 1, wherein a bottom surface of the wavelength conversion layer and the bottom surface of the reflective layer provide a bottom surface of the light-emitting apparatus.

8. The light-emitting apparatus of claim 1, wherein light generated by the light-emitting stack is controlled to adjust a color temperature in a range of about 2,700 K to about 5,000 K.

9. A light source module comprising:
a circuit board comprising a connection pad on a surface of the circuit board; and
a light-emitting apparatus mounted on the circuit board, wherein the light-emitting apparatus comprises:
a reflective layer comprising a cavity that penetrates the reflective layer from a top surface to a bottom surface of the reflective layer;
a light-emitting device disposed in the cavity, the light-emitting device comprising a light-emitting stack and an electrode connected to the light-emitting stack at a bottom surface of the light-emitting stack; and
a wavelength conversion layer that covers at least one of a top surface and a side surface of the light-emitting device,
Wherein the light-emitting stack comprises a first conductive-type semiconductor layer, an active layer, and a second conductive-type semiconductor layer, the electrode comprises a first electrode connected to the first conductive-type semiconductor layer and a second electrode connected to the second conductive-type semiconductor layer, wherein the first electrode penetrates the second conductive-type semiconductor layer and the active layer to be provided as a conductive via connected to the first conductive-type semiconductor layer, and the second electrode is connected to the second conductive-type semiconductor layer, and Wherein the reflective layer further comprises a bottom portion connected to an end portion of a sloped portion of the reflective layer, the bottom portion extending in a direction parallel to the bottom surface of the reflective layer.

10. The light source module of claim 9, wherein a bottom surface of the wavelength conversion layer and the bottom surface of the reflective layer provide a bottom surface of the light-emitting apparatus.

11. The light source module of claim 9, wherein the reflective layer comprises a white silicone sheet.

12. The light source module of claim 9, wherein an area of a top surface of the cavity is greater than an area of a bottom surface of the cavity.

13. A light-emitting apparatus comprising:
a light-emitting stack comprising a first conductive-type semiconductor layer, an active layer, and a second conductive-type semiconductor layer;
a wavelength conversion layer at least a portion of which is disposed above the light-emitting stack and configured to convert a wavelength of at least some of light, emitted from the active layer and having a first wavelength, into a second wavelength;
a reflective layer that surrounds at least side surfaces of the wavelength conversion layer; and
an electrode connected to the light-emitting stack at a bottom surface of the light-emitting stack, wherein the electrode comprise a first electrode and a second electrode,
wherein the first electrode penetrates the second conductive-type semiconductor layer and the active layer to be provided as a conductive via connected to the first conductive-type semiconductor layer, and the second electrode is connected to the second conductive-type semiconductor layer, and
Wherein the reflective layer further comprises a bottom portion connected to an end portion of a sloped portion of the reflective layer, the bottom portion extending in a direction parallel to a bottom surface of the reflective layer.

14. The light-emitting apparatus of claim 13, wherein the bottom surface of the light-emitting stack is positioned at a level higher than a level of the bottom surface of the reflective layer.

15. The light-emitting apparatus of claim 13, wherein the electrode is exposed to an outside.

16. The light-emitting apparatus of claim 13, wherein the reflective layer comprises an inclined portion that is inclined relative to a top surface of the reflective layer, the inclined portion contacting the wavelength conversion layer.

* * * * *